United States Patent
Kim

(10) Patent No.: US 9,946,122 B2
(45) Date of Patent: Apr. 17, 2018

(54) LIQUID CRYSTAL DISPLAY DEVICE AND METHOD FOR MANUFACTURING A SAME

(71) Applicant: SAMSUNG DISPLAY CO., LTD., Yongin-si, Gyeonggi-do (KR)

(72) Inventor: Keunwoo Kim, Seongnam-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/448,673

(22) Filed: Mar. 3, 2017

(65) Prior Publication Data
US 2017/0293186 A1  Oct. 12, 2017

(30) Foreign Application Priority Data
Apr. 12, 2016  (KR) .......... 10-2016-0044784

(51) Int. Cl.
G02F 1/136 (2006.01)
G02F 1/1343 (2006.01)
H01L 27/12 (2006.01)
G02F 1/1362 (2006.01)
G02F 1/1368 (2006.01)

(52) U.S. Cl.
CPC ...... G02F 1/134309 (2013.01); G02F 1/1368 (2013.01); G02F 1/13624 (2013.01); G02F 1/136286 (2013.01); H01L 27/124 (2013.01); H01L 27/1248 (2013.01); H01L 27/1251 (2013.01); G02F 2001/13629 (2013.01); G02F 2001/136245 (2013.01); G02F 2201/123 (2013.01); G02F 2202/10 (2013.01)

(58) Field of Classification Search
CPC ............... G02F 1/13624; G02F 2001/136245
See application file for complete search history.

(56) References Cited

U.S. PATENT DOCUMENTS

| 5,780,327 A | 7/1998 | Chu et al. |
| 8,395,157 B2 * | 3/2013 | Park .................... H01L 27/1225 257/43 |
| 2007/0207574 A1 * | 9/2007 | Wang ................. H01L 29/6675 438/149 |
| 2010/0053488 A1 | 3/2010 | Kim et al. |

(Continued)

FOREIGN PATENT DOCUMENTS

| KR | 10-2010-0024639 A | 3/2010 |
| KR | 10-2013-0104521 A | 9/2013 |

OTHER PUBLICATIONS

Huang, et al. "18.3: Additional Refresh Technology (ART) of Advanced-MVA (AMVA) Mode for High Quality LCDs" SDI 07 Digest, pp. 1010-1013.

*Primary Examiner* — Phu Vu
(74) *Attorney, Agent, or Firm* — Lee & Morse, P.C.

(57) ABSTRACT

A liquid crystal display device includes a first substrate spaced from a second substrate, a liquid crystal layer between the first and second substrates, a gate line, a data line, a first sub-pixel electrode, and a second sub-pixel electrode on the first substrate. The display device also includes a first switch and a second switch. The first switch is connected to the gate line, the data line, and the first sub-pixel electrode. The second switch is connected to the gate line, the data line, and the second sub-pixel electrode. The second switch includes a first gate electrode connected to the gate line and a second gate electrode not connected to the gate line.

21 Claims, 29 Drawing Sheets

(56) References Cited

U.S. PATENT DOCUMENTS

2014/0347591 A1* 11/2014 Park .................. G02F 1/134336
349/43
2016/0202572 A1 7/2016 Chang et al.

* cited by examiner

*TFT2:GE11,GE22,DE2,SE2,322

*TFT1:GE101,DE11,SE11,3321

*TFT2:GE111,GE222,DE22,SE22,3322

LIQUID CRYSTAL DISPLAY DEVICE AND METHOD FOR MANUFACTURING A SAME

CROSS-REFERENCE TO RELATED APPLICATION

Korean Patent Application No. 10-2016-0044784, filed on Apr. 12, 2016, and entitled, "Liquid Crystal Display Device and Method for Manufacturing A Same," is incorporated by reference herein in its entirety.

BACKGROUND

1. Field

One or more embodiments herein relate to a liquid crystal display device and a method for manufacturing a liquid crystal display device.

2. Description of the Related Art

A liquid crystal display (LCD) has a liquid crystal layer between two substrates containing electrodes. When voltages are applied to the electrodes, liquid crystal molecules in the liquid crystal layer rearrange to transmit light to display an image.

In an attempt to improve visibility, each pixel may include two individual sub-pixel electrodes. In such a case, data signals of different levels may be applied to the sub-pixel electrodes, respectively. The data signal is applied to one of the two sub-pixel electrodes without modulation, and the data signal is divided and applied to the other of the two sub-pixel electrodes. The division is performed by a voltage-dividing transistor in the pixel.

The voltage-dividing transistor may cause problems. For example, the voltage-dividing transistor may decrease aperture ratio because it occupies a portion of the pixel. In addition, when the voltage-dividing transistor is turned on, a data line and a storage electrode are electrically connected to each other. As a result, a storage voltage of the storage electrode may vary based on the data signal.

SUMMARY

In accordance with one or more embodiments, a liquid crystal display device includes a first substrate spaced from a second substrate; a liquid crystal layer between the first and second substrates; a gate line, a data line, a first sub-pixel electrode, and a second sub-pixel electrode on the first substrate; a first switch connected to the gate line, the data line, and the first sub-pixel electrode; and a second switch connected to the gate line, the data line, and the second sub-pixel electrode, wherein the first switch includes a first gate electrode connected to the gate line and a first semiconductor layer spaced from the first gate electrode, the second switch includes a second gate electrode connected to the gate line and a second semiconductor layer spaced from the second gate electrode, a first distance between the first gate electrode and the first semiconductor layer is different from a second distance between the second gate electrode and the second semiconductor layer.

The second distance is greater than the first distance.

The second switch further includes a third gate electrode spaced from the second semiconductor layer.

The third gate electrode is connected to the gate line.

The third gate electrode does not contact any conductor including the gate line.

The device further comprising: a bias line to transmit a bias voltage to the third gate electrode.

The first switch further includes a fourth gate electrode connected to the gate line.

In a channel area of the second switch a distance between the second semiconductor layer and the second gate electrode of the second switch is longer than a distance between the second semiconductor layer and the third gate electrode.

The device further comprises a first insulating layer between the second semiconductor layer and the second gate electrode in the channel area; and a second insulating layer between the second semiconductor layer and the third gate electrode in the channel area, wherein the second insulating layer has a smaller thickness than the first insulating layer.

The first insulating layer and the second insulating layer have a unitary construction.

The second switch further includes: a drain electrode on the first substrate and connected to the data line; a source electrode on the drain electrode and connected to the second sub-pixel electrode; and the second semiconductor layer is between the drain electrode and the source electrode.

The device further comprises a first ohmic contact layer between the drain electrode and the second semiconductor layer; and a second ohmic contact layer between the source electrode and the second semiconductor layer.

The second switch further includes a third gate electrode spaced from the second semiconductor layer, and the second gate electrode and the third gate electrode extend in a perpendicular direction with respect to a surface of the first substrate.

The second switch further includes a third gate electrode spaced from the second semiconductor layer, a first portion of the second gate electrode and a first portion of the third gate electrode are on a same layer as the first ohmic contact layer, and a second portion of the second gate electrode and a second portion of the third gate electrode are on a same layer as the second ohmic contact layer.

The second switch further includes a third gate electrode spaced from the second semiconductor layer, and at least a portion of the second gate electrode and at least a portion of the third gate electrode are on a same layer as the second semiconductor layer.

The second switch further includes a third gate electrode spaced from the second semiconductor layer, a first portion of the second gate electrode and a first portion of the third gate electrode are on a same layer as the drain electrode, and a second portion of the second gate electrode and a second portion of the third gate electrode are on a same layer as the source electrode.

The second gate electrode and the gate line are on different layers.

The second gate electrode is on a same layer as one of the first sub-pixel electrode or the second sub-pixel electrode.

The second gate electrode includes a same material as one of the first sub-pixel electrode, the second sub-pixel electrode, or the gate line.

The device further comprises an insulating layer having a contact hole connecting the second gate electrode and the gate line.

In accordance with one or more other embodiments, a method for manufacturing a liquid crystal display device includes sequentially stacking a first metal layer, a first impurity semiconductor material layer, a semiconductor material layer, a second impurity semiconductor material layer, and a second metal layer on a substrate; forming a first photoresist pattern and a second photoresist pattern on the second metal layer, the second photoresist pattern having a thickness less than the first photoresist pattern; forming a drain electrode on the substrate, a first ohmic contact layer on the drain electrode, a semiconductor layer on the first ohmic contact layer, an impurity semiconductor pattern on the semiconductor layer, and a source metal layer on the impurity semiconductor pattern by removing the first metal layer, the first impurity semiconductor material layer, the semiconductor material layer, the second impurity semiconductor material layer, and the second metal layer using the first and second photoresist patterns as a mask; removing a portion of the first photoresist pattern and the second photoresist pattern; forming a second ohmic contact layer on the semiconductor layer and a source electrode on the second ohmic contact layer by removing the impurity semiconductor pattern and the source metal layer using the first photoresist pattern as a mask; removing the first photoresist pattern; forming a gate insulating layer on the substrate, the semiconductor layer, and the source electrode; defining a first hole in the gate insulating layer; forming a first gate electrode in the first hole of the gate insulating layer; forming a passivation layer on the gate line; defining a contact hole in the passivation layer, the contact hole exposing the source electrode; and forming a pixel electrode on the passivation layer, the pixel electrode connected to the source electrode through the contact hole.

The method may include forming, on the substrate, a data line connected to the drain electrode. The method may include forming, on the passivation layer, a gate line connected to the gate electrode. The method may include forming, on the passivation layer, a color filter having a contact hole corresponding to the source contact hole. The method may include defining a second hole in the gate insulating layer; and forming a second gate electrode in the second hole, the second gate electrode not connected to any conductor. A thickness of the gate insulating layer between a channel area of the semiconductor layer and the second gate electrode may be less than a thickness of the gate insulating layer between the channel area and the first gate electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
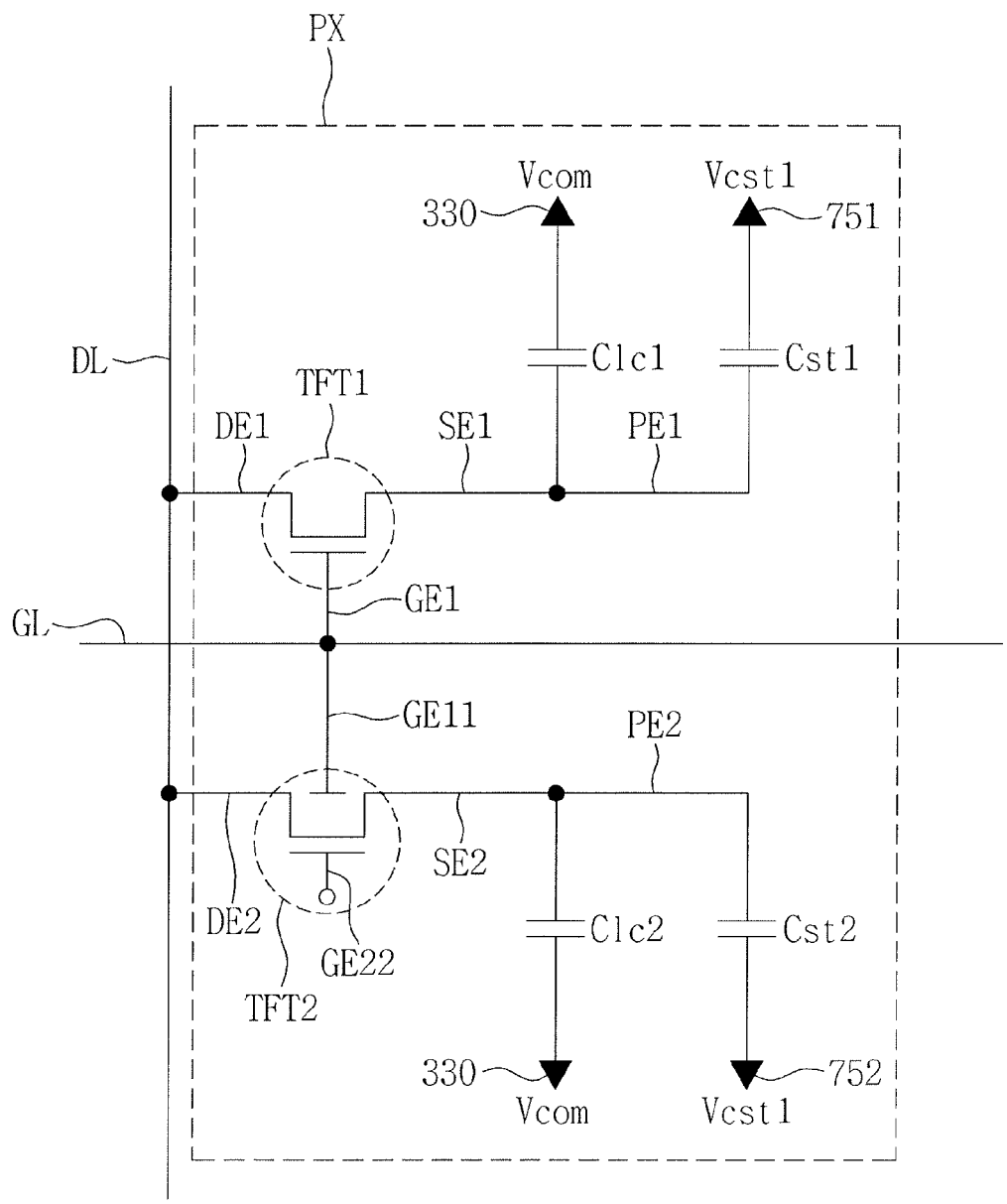
FIG. 1 illustrates an equivalent circuit diagram of a pixel provided in an implementation of a liquid crystal display (LCD) device.

Example embodiments will now be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

FIG. 1 illustrates an equivalent circuit diagram of an embodiment of a pixel PX of an LCD device. As illustrated in FIG. 1, the pixel PX includes a first switching element TFT1, a second switching element TFT2, a first sub-pixel electrode PE1, a second sub-pixel electrode PE2, a first liquid crystal capacitor Clc1, a second liquid crystal capacitor Clc2, a first storage capacitor Cst1, and a second storage capacitor Cst2.

The first switching element TFT1 is connected to a gate line GL, a data line DL, and the first sub-pixel electrode PE1. The first switching element TFT1 is controlled based on a gate signal from the gate line GL and is connected between the data line DL and the first sub-pixel electrode PE1. The first switching element TFT1 is turned on by a gate high voltage of the gate signal and, when turned on, applies a data voltage applied from the data line DL to the first sub-pixel electrode PE1 In an implementation, the first switching element TFT1 is turned off by a gate low voltage of the gate signal. The data voltage is an image data voltage.

The first switching element TFT1 includes a first gate electrode GE1 connected to the gate line GL, a first drain electrode DE1 connected to the data line DL, and a first source electrode SE1 connected to the second sub-pixel electrode PE2.

The first liquid crystal capacitor Clc1 is between the first sub-pixel electrode PE1 and a common electrode 330. The first liquid crystal capacitor Clc1 includes a first electrode connected to the first sub-pixel electrode PE1, a second electrode connected to the common electrode 330, and a liquid crystal layer between the first electrode and the second electrode. The first electrode of the first liquid crystal capacitor Clc1 may be a portion of the first sub-pixel electrode PE1. The second electrode of the first liquid crystal capacitor Clc1 may be a portion of the common electrode 330.

A common voltage Vcom is applied to the common electrode 330.

The first storage capacitor Cst1 is between the first sub-pixel electrode PE1 and a first storage electrode 751. The first storage capacitor Cst1 includes a first electrode connected to the first sub-pixel electrode PE1, a second electrode connected to the first storage electrode 751, and a dielectric material between the first electrode of the first storage capacitor Cst1 and the second electrode of the first storage capacitor Cst1. The dielectric material includes at least one insulating layer. The first electrode of the first storage capacitor Cst1 may be a portion of the first sub-pixel electrode PE1. The second electrode of the first storage capacitor Cst1 may be a portion of the first storage electrode 751.

A first storage voltage Vcst1 is applied to the first storage electrode 751. The first storage voltage Vcst1 may have a voltage level equal to that of the common voltage Vcom.

The second switching element TFT2 is connected to the gate line GL, the data line DL, and the second sub-pixel electrode PE2. The second switching element TFT2 is controlled by the gate signal from the gate line GL and is connected between the data line DL and the second sub-pixel electrode PE2. The second switching element TFT2 is turned on by the gate high voltage of the gate signal, and, when turned on, applies a data voltage applied from the data line DL to the second sub-pixel electrode PE2. The second switching element TFT2 is turned off by the gate low voltage of the gate signal. The data voltage is an image data voltage.

The second switching element TFT2 includes a first gate electrode GE11 (an auxiliary gate electrode) connected to the gate line GL, a second drain electrode DE2 connected to the data line DL, a second source electrode SE2 connected to the second sub-pixel electrode PE2, and a second gate electrode GE22 (main gate electrode) having a floating structure.

The main gate electrode GE22 may not physically contact any conductor including the gate line GL.

In a channel area CA2 of the second switching element TFT2, a distance between a semiconductor layer 322 and the auxiliary gate electrode GE11 of the second switching element TFT2 may be a first distance and a distance between the semiconductor layer 322 and the main gate electrode GE22 thereof may be a second distance. The first distance is greater than the second distance. Accordingly, when receiving the gate high voltage through the auxiliary gate electrode GE11, rather than through the main gate electrode GE22, the second switching element TFT2 exhibits lower current driving capability. As illustrated in FIG. 1, since connected to the gate line GL through the auxiliary gate electrode GE11, the second switching element TFT2 has relatively lower current driving capability.

In an implementation, the second switching element TFT2 connected to the gate line GL through the main gate electrode GE22, rather than through the auxiliary gate electrode GE11, may have lower or higher current driving capability than that of the first switching element TFT1. In addition, the second switching element TFT2 connected to the gate line GL through both of the auxiliary gate electrode GE11 and the main gate electrode GE22 may have lower or higher current driving capability than that of the first switching element TFT1.

The second liquid crystal capacitor Clc2 is between the second sub-pixel electrode PE2 and the common electrode 330. The second liquid crystal capacitor Clc2 includes a first electrode connected to the second sub-pixel electrode PE2, a second electrode connected to the common electrode 330, and a liquid crystal layer between the first electrode of the second liquid crystal capacitor Clc2 and the second electrode of the second liquid crystal capacitor Clc2. The first electrode of the second liquid crystal capacitor Clc2 may be a portion of the second sub-pixel electrode PE2. The second electrode of the second liquid crystal capacitor Clc2 may be a portion of the common electrode 330.

The second storage capacitor Cst2 is between the second sub-pixel electrode PE2 and a second storage electrode 752. The second storage capacitor Cst2 includes a first electrode connected to the second sub-pixel electrode PE2, a second electrode connected to the second storage electrode 752, and a dielectric material between the first electrode of the second storage capacitor Cst2 and the second electrode of the second storage capacitor Cst2. The dielectric material includes at least one insulating layer. The first electrode of the second storage capacitor Cst2 may be a portion of the second sub-pixel electrode PE2. The second electrode of the second storage capacitor Cst2 may be a portion of the second storage electrode 752.

A second storage voltage Vcst2 is applied to the second storage electrode 752. The second storage voltage Vcst2 may have a voltage level equal to that of the common voltage Vcom.

The aforementioned gate high voltage is a high logic voltage of the gate signal and is set to be a voltage greater than or equal to a higher one of a threshold voltage of the first switching element TFT1 or a threshold voltage of the second switching element TFT2. The aforementioned gate low voltage is a low logic voltage of the gate signal and is set to be an off-voltage of the first switching element TFT1 and the second switching element TFT2.

In operation, when the gate high voltage is applied to the gate line GL, the first switching element TFT1 and the second switching element TFT2 are turned on. A data voltage from the data line DL is applied to the first sub-pixel electrode PE1 through the turned-on first switching element TFT1. In such an implementation, due to a voltage drop arising from an inner resistance of the first switching element TFT1, a data voltage (first sub-pixel voltage) of the first sub-pixel electrode PE1 has a lower voltage level than that of the data voltage of the data line DL.

A data voltage from the data line DL is applied to the second sub-pixel electrode PE2 through the turned-on second switching element TFT2. In such an implementation, due to a voltage drop arising from an inner resistance of the second switching element TFT2, a data voltage (second sub-pixel voltage) of the second sub-pixel electrode PE2 has a lower voltage level than that of the data voltage of the data line DL.

The turned-on first switching element TFT1 and the turned-on second switching element TFT2 both operate in a linear region. Based on the inner resistances of the first switching element TFT1 and the second switching element TFT2, a ratio between the first sub-pixel voltage and the second sub-pixel voltage may be calculated.

As described hereinabove, the second switching element TFT2 has lower current driving capability than that of the first switching element TFT1. Accordingly, the second switching element TFT2 has greater inner resistance than that of the first switching element TFT1. Accordingly, the first sub-pixel voltage and the second sub-pixel voltage may have different values. For example, the second sub-pixel voltage is lower than the first sub-pixel voltage. Accordingly, visibility of a pixel may be improved.

In addition, only two switching elements (e.g., the first switching element TFT1 and the second switching element TFT2) may be used to generate two sub-pixel voltages having different voltage levels. Thus, the aperture ratio of the pixel may increase.

The data line DL and the first and second storage electrodes 751 and 752 are not directly connected to one another. Thus, variation of the first storage voltage Vcst1 and the second storage voltage Vcst2 may be significantly reduced. For example, the first storage capacitor Cst1 and the second storage capacitor Cst2 are connected among respective ones of the storage electrodes 751 and 752 and the data line DL, respectively. Thus, variation of the first storage voltage Vcst1 and the second storage voltage Vcst2 may be significantly reduced.

Such a pixel circuit may be achieved through a pixel configuration to be described hereinbelow. Hereinbelow, a pixel configuration corresponding to the pixel circuit illustrated in FIG. 1 will be described.

Figure 2:
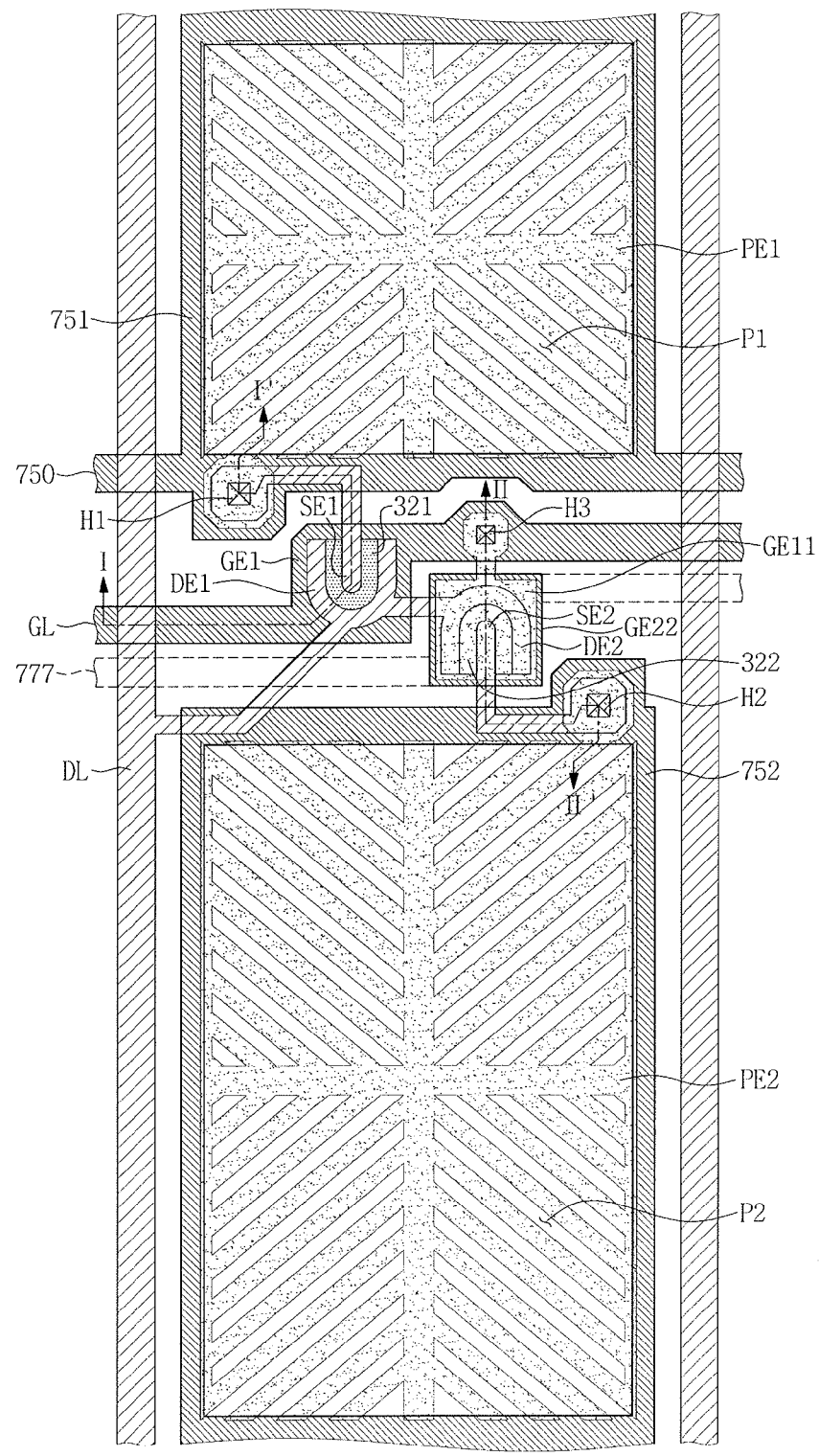
FIG. 2 illustrates a plan view of an implementation of an LCD device including a pixel configuration corresponding to the pixel circuit of FIG. 1.
Figure 3:
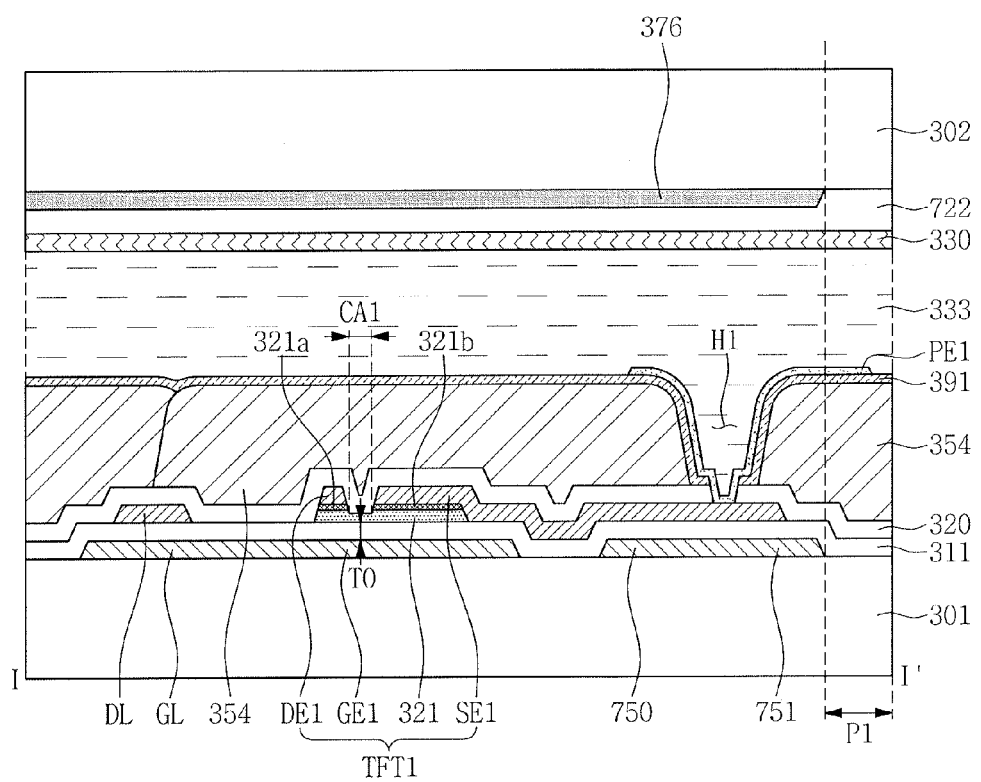
FIG. 3 illustrates a cross-sectional view taken along line I-I' of FIG. 2.
Figure 4:
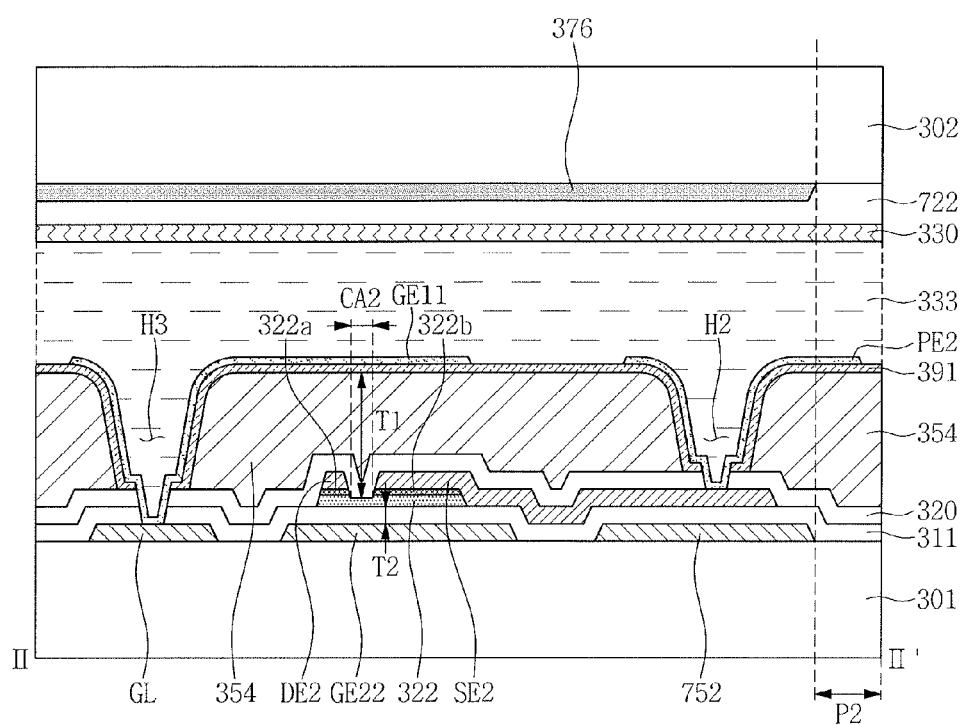
FIG. 4 illustrates a cross-sectional view taken along line II-II' of FIG. 2.

FIG. 2 illustrates a plan or layout view of an embodiment of an LCD device including a pixel configuration corresponding to the pixel circuit of FIG. 1. FIG. 3 illustrates a cross-sectional view taken along line I-I' of FIG. 2. FIG. 4 illustrates a cross-sectional view taken along line II-II' of FIG. 2.

As illustrated in FIGS. 2, 3, and 4, the LCD device includes a first substrate 301, a gate line GL, a first gate electrode GE1, a main gate electrode GE22, an auxiliary gate electrode GE11, a first storage electrode 751, a storage line 750, a second storage electrode 752, a gate insulating layer 311, a first semiconductor layer 321, a second semiconductor layer 322, a first ohmic contact layer 321a, a second ohmic contact layer 321b, a third ohmic contact layer 322a, a fourth ohmic contact layer 322b, a data line DL, a first drain electrode DE1, a first source electrode SE1, a second drain electrode DE2, a second source electrode SE2, a passivation layer 320, a capping layer 391, a color filter 354, a first sub-pixel electrode PE1, a second sub-pixel electrode PE2, a second substrate 302, a light blocking layer 376, an overcoat layer 722, a common electrode 330, and a liquid crystal layer 333. In an implementation, at least one of the first ohmic contact layer 321a, the second ohmic contact layer 321b, the third ohmic contact layer 322a, or the fourth ohmic contact layer 322b may be omitted.

As illustrated in FIGS. 2 and 3, the first switching element TFT1 includes the first gate electrode GE1, the first semiconductor layer 321, the first drain electrode DE1, and the first source electrode SE1.

As illustrated in FIGS. 2 and 4, the second switching element TFT2 includes the main gate electrode GE22, the auxiliary gate electrode GE11, the second semiconductor layer 322, the second drain electrode DE2, and the second source electrode SE2.

As illustrated in FIGS. 2 and 3, the gate line GL is on the first substrate 301. For example, the gate line GL may be between a first sub-pixel area P1 and a second sub-pixel area P2 of the first substrate 301.

As illustrated in FIGS. 2 and 3, the gate line GL is connected to the first gate electrode GE1. The gate line GL and the first gate electrode GE1 may have a unitary construction, e.g., a one-piece, monolithic structure. In an implementation, an end portion of the gate line GL may be connected to another layer or an external driving circuit. The end portion of the gate line GL may have a larger area than an area of another portion thereof.

The gate line GL may include or be formed of, e.g., aluminum (Al) or alloys thereof, silver (Ag) or alloys thereof, copper (Cu) or alloys thereof, and/or molybdenum (Mo) or alloys thereof. In an implementation, the gate line GL may include or be formed of, e.g., one of chromium (Cr), tantalum (Ta) and titanium (Ti). In an implementation, the gate line GL may have a multilayer structure including at least two conductive layers having different physical properties from one another.

As illustrated in FIG. 2, the first gate electrode GE1 may have a shape protruding from the gate line GL. The first gate electrode GE1 may be a portion of the gate line GL. The first gate electrode GE1 may include substantially a same material and may have a same structure (multilayer structure) as those of the gate line GL. In an implementation, the first gate electrode GE1 and the gate line GL may be simultaneously formed in a same process.

As illustrated in FIG. 2, the main gate electrode GE22 has a floating structure not connected to any conductor. The main gate electrode GE22 may include substantially a same material and may have a same structure (multilayer structure) as those of the gate line GL. The main gate electrode GE22 and the gate line GL may be simultaneously formed in a same process. In an implementation, the main gate electrode GE22 may be connected to a bias line 777. The bias line 777 transmits a constant direct current (DC) voltage (a bias voltage) to the main gate electrode GE22.

As illustrated in FIG. 2, the first storage electrode 751 may have a shape enclosing the first sub-pixel electrode PE1. The first storage electrode 751 may overlap an edge portion of the first sub-pixel electrode PE1. The first storage voltage Vcst1 is applied to the first storage electrode 751. The first storage voltage Vcst1 may have a voltage level equal to that of the common voltage Vcom. The first storage electrode 751 may include substantially a same material and have a same structure (multilayer structure) as those of the gate line GL. In an implementation, the first storage electrode 751 and the gate line GL may be simultaneously formed in a same process.

The first storage electrode 751 is connected to the storage line 750. As illustrated in FIG. 2, the storage line 750 is between the first sub-pixel area P1 and the second sub-pixel area P2. The storage line 750 is parallel to the gate line GL. The first storage voltage Vcst1 is applied to the storage line 750. In such an implementation, the first storage electrode 751 and the storage line 750 may have a unitary construction, e.g., may have a one-piece, monolithic structure. The storage line 750 may include substantially a same material and have a same structure (multilayer structure) as those of the gate line GL. The storage line 750 and the gate line GL may be simultaneously formed in a same process.

As illustrated in FIG. 2, the second storage electrode 752 may have a shape enclosing the second sub-pixel electrode PE2. The second storage electrode 752 may overlap an edge portion of the second sub-pixel electrode PE2. The second storage electrode 752 may include substantially a same material and have a same structure (a multilayer structure) as those of the gate line GL. The second storage electrode 752 and the gate line GL may be simultaneously formed in a same process.

The second storage voltage Vcst2 is applied to the second storage electrode 752. The second storage voltage Vcst2 may have a voltage level equal to that of the common voltage Vcom. In an implementation, the second storage electrode 752 and the first storage electrode 751 may have a unitary construction, e.g., a one-piece, monolithic structure. The second storage electrode 752 may include substantially a same material and have a same structure (a multilayer structure) as those of the gate line GL. In an implementation, the second storage electrode 752 and the gate line GL may be simultaneously formed in a same process.

As illustrated in FIGS. 3 and 4, the gate insulating layer 311 is on the gate line GL, the first gate electrode GE1, the main gate electrode GE22, the first storage electrode 751, the second storage electrode 752, and the storage line 750. In such an implementation, the gate insulating layer 311 is over an entire surface of the first substrate 301 including the gate line GL, the first gate electrode GEL the main gate electrode GE22, the first storage electrode 751, the second storage electrode 752, and the storage line 750. The gate insulating layer 311 has a hole corresponding to the gate line GL. The gate insulating layer 311 may include or be formed of, e.g., silicon nitride ($SiN_x$) or silicon oxide ($SiO_x$). The gate insulating layer 311 may have a multilayer structure including at least two insulating layers having different physical properties.

As illustrated in FIG. 3, the data line DL is on the gate insulating layer 311. An end portion of the data line DL may be connected to another layer or an external driving circuit. The end portion of the data line DL may have a larger area than that of another portion of the data line DL.

The data line DL intersects the gate line GL and the storage line 750. A portion of the data line DL intersecting the gate line GL may have a smaller line width than that of another portion of the data line DL. Similarly, a portion of the data line DL intersecting the storage line 750 may have a smaller line width than that of another portion of the data line DL. Accordingly, parasitic capacitance between the data line DL and the gate line GL and capacitance between the data line DL and the storage line 750 may be reduced.

The data line DL may include or be formed of, e.g., refractory metal, such as molybdenum, chromium, tantalum and titanium, or an alloy thereof. The data line DL may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an implementation, the data line DL may include or be formed of suitable metals or conductors rather than the aforementioned materials.

As illustrated in FIG. 3, the first semiconductor layer 321 is on the gate insulating layer 311. As illustrated in FIGS. 2 and 3, the first semiconductor layer 321 may overlap at least a portion of the first gate electrode GE1. The first semiconductor layer 321 may include or be formed of, e.g., amorphous silicon, polycrystalline silicon, or the like.

As illustrated in FIG. 3, the first ohmic contact layer 321*a* and the second ohmic contact layer 321*b* are on the first semiconductor layer 321. The first ohmic contact layer 321*a* and the second ohmic contact layer 321*b* may face or be laterally aligned with each other, with a channel area CA1 of the first switching element TFT1 therebetween. At least one of the first ohmic contact layer 321*a* and the second ohmic contact layer 321*b* may include or be formed of silicide or n+ hydrogenated amorphous silicon doped with n-type impurity ions, e.g., phosphorus or hydrogen phosphide ($PH_3$), at high concentration.

As illustrated in FIG. 4, the second semiconductor layer 322 is on the gate insulating layer 311. As illustrated in FIGS. 2 and 4, the second semiconductor layer 322 overlaps at least a portion of the main gate electrode GE22 and the auxiliary gate electrode GE11. The second semiconductor layer 322 may include or be formed of, e.g., amorphous silicon, polycrystalline silicon, or the like.

As illustrated in FIG. 4, the third ohmic contact layer 322*a* and the fourth ohmic contact layer 322*b* are on the second semiconductor layer 322. The third ohmic contact layer 322*a* and the fourth ohmic contact layer 322*b* may face or be laterally aligned with each other, with a channel area CA2 of the second switching element TFT2 therebetween. At least one of the third ohmic contact layer 322*a* and the fourth ohmic contact layer 322*b* may include or be formed of silicide or n+ hydrogenated amorphous silicon doped with n-type impurities, such as phosphorus or hydrogen phosphide ($PH_3$), at high concentration.

The third ohmic contact layer 322*a* and the aforementioned first ohmic contact layer 321*a* are connected to each other. For example, the third ohmic contact layer 322*a* and the aforementioned first ohmic contact layer 321*a* may have a unitary construction, e.g., a one-piece, monolithic structure.

As illustrated in FIG. 3, the first drain electrode DE1 is on the first ohmic contact layer 321*a*. In an implementation, the first drain electrode DE1 may also be on the gate insulating layer 311. The first drain electrode DE1, as illustrated in FIG. 2, may have a shape protruding from the data line DL. In an implementation, the first drain electrode DE1 may be a portion of the data line DL. At least a portion of the first drain electrode DE1 overlaps the first semiconductor layer 321 and the first gate electrode GE1. In an implementation, the first drain electrode DE1 may have a predetermined shape, e.g., an I-shape, a C-shape, or a U-shape. The first drain electrode DE1 in FIG. 2 to have a U-shape. A convex portion of the first drain electrode DE1 faces the second sub-pixel electrode PE2. The first drain electrode DE1 may include substantially a same material and may have a same structure (multilayer structure) as those of the data line DL. In an implementation, the first drain electrode DE1 and the data line DL may be simultaneously formed in a same process.

As illustrated in FIG. 3, the first source electrode SE1 is on the second ohmic contact layer 321*b* and the gate insulating layer 311. At least a portion of the first source electrode SE1 overlaps the first semiconductor layer 321 and the first gate electrode GE1. The first source electrode SE1 is connected to the first sub-pixel electrode PE1. The first source electrode SE1 may include substantially a same material and may have a same structure (multilayer structure) as those of the data line DL. In an implementation, the first source electrode SE1 and the data line DL may be simultaneously formed in a same process.

The channel area CA1 of the first switching element TFT1 is in a portion of the first semiconductor layer 321 between the first drain electrode DE1 and the first source electrode SE1.

As illustrated in FIG. 4, the second drain electrode DE2 is on the third ohmic contact layer 322a. The second drain electrode DE2 may also be on the gate insulating layer 311. The second drain electrode DE2 and the first drain electrode DE1 may have a unitary construction, e.g., a one-piece, monolithic structure. At least a portion of the second drain electrode DE2 overlaps the second semiconductor layer 322, the main gate electrode GE22, and the auxiliary gate electrode GE11. In an implementation, the second drain electrode DE2 has a predetermined shape, e.g., an I-shape, a C-shape, or a U-shape. The second drain electrode DE2 in FIG. 2 has a U-shape. A convex portion of the second drain electrode DE2 faces the first sub-pixel electrode PE1. The second drain electrode DE2 may include substantially a same material and may have a same structure (multilayer structure) as those of the data line DL. In an implementation, the second drain electrode DE2 and data line DL may be simultaneously formed in a same process.

As illustrated in FIG. 4, the second source electrode SE2 is on the fourth ohmic contact layer 322b and the gate insulating layer 311. At least a portion of the second source electrode SE2 overlaps the second semiconductor layer 322 and the main gate electrode GE22. The second source electrode SE2 is connected to the second sub-pixel electrode PE2. The second source electrode SE2 may include substantially a same material and may have a same structure (a multilayer structure) as those of the data line DL. In an implementation, the second source electrode SE2 and the data line DL may be simultaneously formed in a same process.

The channel area CA2 of the second switching element TFT2 may be in a portion of the second semiconductor layer 322 between the second drain electrode DE2 and the second source electrode SE2.

As illustrated in FIGS. 3 and 4, the passivation layer 320 is on the data line DL, the first drain electrode DE1, the second drain electrode DE2, the first source electrode SE1, and the second source electrode SE2. In such an implementation, the passivation layer 320 is on the entire surface of the first substrate 301 including the data line DL, the first drain electrode DE1, the second drain electrode DE2, the first source electrode SE1, and the second source electrode SE2. The passivation layer 320 has a first hole above the first source electrode SE1, a second hole above the second source electrode SE2, and a third hole above the hole of the gate insulating layer 311.

The passivation layer 320 may include or be formed of, e.g., an inorganic insulating material such as silicon nitride ($SiN_x$) or silicon oxide ($SiO_x$). In such an implementation, an inorganic insulating material having photosensitivity and a dielectric constant of, for example, about 4.0 may be used. In an implementation, the passivation layer 320 may have a double-layer structure, including a lower inorganic layer and an upper organic layer. Such a structure may impart improved insulating properties and also may help reduce and/or prevent damage to exposed portions of the first semiconductor layer 321 and the second semiconductor layer 322. In an implementation, the passivation layer 320 may have a thickness greater than or equal to about 5,000 Å, e.g., about 6,000 Å to about 8,000 Å.

As illustrated in FIGS. 3 and 4, the color filter 354 is on the passivation layer 320. The color filter 354 is in the first sub-pixel area P1 and the second sub-pixel area P2, and in such an implementation, an edge portion of the color filter 354 is on the data line DL. An edge portion of one of the color filters 354 may overlap an edge portion of an adjacent one of the color filters 354. Color filters having a same color are respectively disposed in the first sub-pixel area P1 and the second sub-pixel area P2 in a single pixel. The color filter 354 has a first hole, a second hole, and a third hole. In such an implementation, the first hole of the color filter 354 is above the first hole of the passivation layer 320. The second hole of the color filter 354 is positioned the second hole of the passivation layer 320. The third hole of the color filter 354 is above the third hole of the passivation layer 320. The color filter 354 may include a photosensitive organic material.

As illustrated in FIGS. 3 and 4, the capping layer 391 is on the color filter 354. The capping layer 391 may help reduce and/or prevent infiltration of undesirable materials, generated in the color filter 354, into the liquid crystal layer 333. The capping layer 391 has a first hole, a second hole, and a third hole. In such an implementation, the first hole of the capping layer 391 is above the first hole of the color filter 354, the second hole of the capping layer 391 is above the second hole of the color filter 354, and the third hole of the capping layer 391 is above the third hole of the color filter 354. The capping layer 391 may include, for example, silicon nitride or silicon oxide.

A first contact hole H1 includes the first hole of the passivation layer 320, the first hole of the color filter 354, and the first hole of the capping layer 391. A portion of the first source electrode SE1 is exposed through the first contact hole H1. The holes of the first contact hole H1 have larger size as positioned more upwardly. Accordingly, the first sub-pixel electrode PE1 on an inner wall of the first contact hole H1 may have a plurality of curved portions. Accordingly, the first sub-pixel electrode PE1 may not be damaged in the first contact hole H1 which has a large depth. For example, the first sub-pixel electrode PE1 may be prevented from being cut.

A second contact hole H2 includes the second hole of the passivation layer 320, the second hole of the color filter 354, and the second hole of the capping layer 392. A portion of the second source electrode SE2 is exposed through the second contact hole 112. In this regard, the holes of the second contact hole H2 may have larger size as positioned more upwardly. Accordingly, the second sub-pixel electrode PE2 on an inner wall of second contact hole H2 may have a plurality of curved portions. Accordingly, the second sub-pixel electrode PE2 may not be damaged in the second contact hole H2 which has a large depth. For example, the second sub-pixel electrode PE2 may be prevented from being cut.

A third contact hole H3 includes the hole of the gate insulating layer 311, the third hole of the passivation layer 330, the third hole of the color filter 354, and the third hole of the capping layer 393. A portion of the gate line GL is exposed through the third contact hole H3. In this regard, the holes of the third contact hole 113 may increase in size in an upward direction. Accordingly, the auxiliary gate electrode GE11 on an inner wall of the third contact hole H3 may have a plurality of curved portions. Accordingly, the auxiliary gate electrode GE11 may not be damaged in the third contact hole H3 which has a large depth. For example, the auxiliary gate electrode GE11 may be prevented from being cut.

In the channel area CA2 of the second switching element TFT2, a distance between the second semiconductor layer 322 and the auxiliary gate electrode GE11 of the second switching element TFT2 is longer than a distance between the second semiconductor layer 322 and the main gate electrode GE22 thereof. To this end, the thickness of the insulating layer between the second semiconductor layer 322 and the auxiliary gate electrode GE11 in the channel area CA2 may be larger than the thickness of the insulating layer between the second semiconductor layer 322 and the main gate electrode GE22 in the channel area CA2. For example, as illustrated in FIG. 4, a thickness T1 of the insulating layer (first insulating layer) between the second semiconductor layer 322 and the auxiliary gate electrode GE11 may correspond to a total thickness of a thickness of the passivation layer 320, a thickness of the color filter 354, and a thickness of the capping layer 391.

A thickness T2 of the insulating layer (second insulating layer) between the second semiconductor layer 322 and the main gate electrode GE22 may correspond to a thickness of the gate insulating layer 311. In this regard, the first insulating layer has a larger thickness than that of the second insulating layer (T1>T2).

In an implementation, when the color filter 354 is on the second substrate 302, rather than on the first substrate 301, the first insulating layer only includes the passivation layer 320. In such an implementation, the passivation layer 320 may have a larger thickness than that of the gate insulating layer 311.

A distance (hereinafter, a first distance) between the first gate electrode GE1 of the first switching element TFT1 and the first semiconductor layer 321 of the first switching element TFT1 at the channel area CA1 of the first switching element TFT1 is defined as T0. A distance (hereinafter, a second distance) between the auxiliary gate electrode GE11 of the second switching element TFT2 and the second semiconductor layer 322 of the second switching element TFT2 at the channel area CA2 of the second switching element TFT2 is defined as T1. The first distance T0 is different from the second distance T1. For example, the second distance T1 may be greater than the first distance T0.

As illustrated in FIG. 2, the first sub-pixel electrode PE1 is in the first sub-pixel area P1. In such an implementation, the first sub-pixel electrode PE1 is on the capping layer 391. The first sub-pixel electrode PE1 is connected to the first source electrode SE1 through the first contact hole H1.

The first sub-pixel electrode PE1 may include or be formed of, e.g., a transparent conductive material, such as indium tin oxide (ITO) or indium zinc oxide (IZO). For example, ITO may be a polycrystalline or monocrystalline material and IZO may also be a polycrystalline or monocrystalline material. In an implementation, IZO may be an amorphous material.

Figure 5:
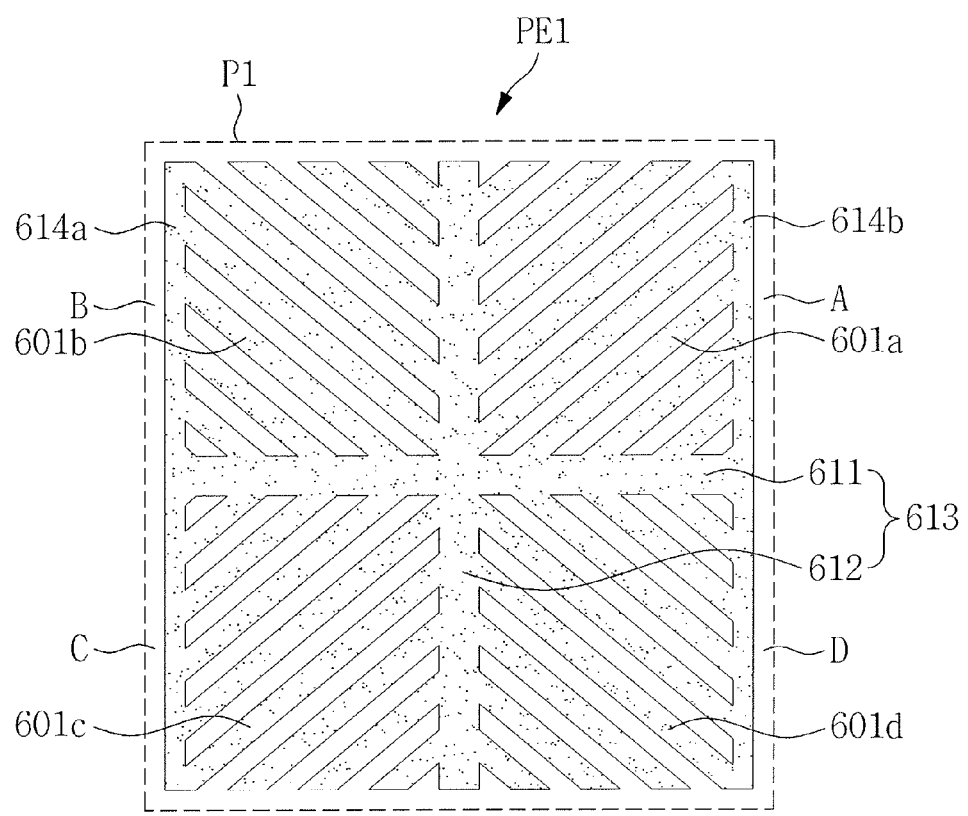
FIG. 5 separately illustrates a first sub-pixel electrode of FIG. 2.

FIG. 5 illustrates an embodiment of the first sub-pixel electrode PE1 of FIG. 2. The first sub-pixel electrode PE1 may include a stem electrode 613 and a plurality of branch electrodes 601a, 601b, 601c, and 601d. The stem electrode 613 and the branch electrodes 601a, 601b, 601c, and 601d may be formed to have a unitary construction.

The stem electrode 613 divides the first sub-pixel area P1 into a plurality of domains. In an implementation, the stem electrode 613 includes a horizontal portion 611 and a vertical portion 612 intersecting each other. The horizontal portion 611 divides the first sub-pixel area P1 into two domains. The vertical portion 612 divides each of the divided two domains into another two smaller domains. A pixel area P is divided into four domains A, B, C, and D by the stem electrode 613 including the horizontal portion 611 and the vertical portion 612.

The branch electrodes 601a, 601b, 601c, and 601d include first, second, third, and fourth branch electrodes 601a, 601b, 601c, and 601d, each extending from the stem electrode 613 into directions different from one another. For example, the first, second, third, and fourth branch electrodes 601a, 601b, 601c, and 601d extend from the stem electrode 613 into respective ones of the domains A, B, C, and D. For example, the first branch electrode 601a is in the first domain A, the second branch electrode 601b is in the second domain B, the third branch electrode 601c is in the third domain C, and the fourth branch electrode 601d is in the fourth domain D.

The first branch electrode 601a and the second branch electrode 601b may form a symmetrical shape with respect to the vertical portion 612. The third branch electrode 601c and the fourth branch electrode 601d may form a symmetrical shape with respect to the vertical portion 612. In addition, the first branch electrode 601a and the fourth branch electrode 601d may form a symmetrical shape with respect to the horizontal portion 611. The second branch electrode 601b and the third branch electrode 601c may form a symmetrical shape with respect to the horizontal portion 611.

The first branch electrode 601a may include a plurality of first branch electrodes 601a in the first domain A. In such an implementation, the plurality of first branch electrodes 601a are aligned parallel to one another. In this regard, part of the first branch electrodes 601a extend from a side of the horizontal portion 611 contacting the first domain A in a diagonal direction with respect to the side thereof. In addition, other or remaining ones of the first branch electrodes 601a extend from a side of the vertical portion 612 contacting the first domain A in a diagonal direction with respect to the side thereof.

The second branch electrode 601b may include a plurality of second branch electrodes 601b in the second domain B. In such an implementation, the plurality of second branch electrodes 601b are aligned parallel to one another. In this regard, part of the second branch electrodes 601b extend from a side of the horizontal portion 611 contacting the second domain B in a diagonal direction with respect to the side thereof. In addition, the rest of the second branch electrodes 601b extend from a side of the vertical portion 612 contacting the second domain B in a diagonal direction with respect to the side thereof.

The third branch electrode 601c may include a plurality of third branch electrodes 601c in the third domain C. In such an implementation, the plurality of third branch electrodes 601c are aligned parallel to one another. In this regard, part of the third branch electrodes 601c extend from a side of the horizontal portion 611 contacting the third domain C in a diagonal direction with respect to the side thereof. In addition, other or remaining ones of the third branch electrodes 601c extend from a side of the vertical portion 612 contacting the third domain C in a diagonal direction with respect to the side thereof.

The fourth branch electrode 601d may include a plurality of fourth branch electrodes 601d in the fourth domain D. In such an implementation, the plurality of fourth branch electrodes 601d are aligned parallel to one another. In this regard, a part of the fourth branch electrodes 601d extend from a side of the horizontal portion 611 contacting the fourth domain D in a diagonal direction with respect to the side thereof. Further, the rest of the fourth branch electrodes 601d extend from a side of the vertical portion 612 contacting the fourth domain D in a diagonal direction with respect to the side thereof.

In an implementation, the aforementioned stem electrode 613 may further include a first connecting portion 614a and a second connecting portion 614b. The first connecting portion 614a is connected to one end portion of the horizontal portion 611. The second connecting portion 614b is connected to another end portion of the horizontal portion 611. The first connecting portion 614a and the second connecting portion 614b may be aligned parallel to the vertical portion 612. The first connecting portion 614a and the second connecting portion 614b may have a unitary construction with the stem electrode 613.

End portions of at least two of the first branch electrodes 601a in the first domain A and end portions of at least two of the fourth branch electrodes 601d in the fourth domain D may be connected to one another by the second connecting portion 614b. Similarly, end portions of at least two of the second branch electrodes 601b in the second domain B and end portions of at least two of the third branch electrodes 601c in the third domain C may be connected to one another by the first connecting portion 614a.

In an implementation, end portions of at least two of the first branch electrodes 601a in the first domain A and end portions of at least two of the second branch electrodes 601b in the second domain B may be connected to one another by another connecting portion. Further, end portions of at least two of the third branch electrodes 601c in the third domain C and end portions of at least two of the fourth branch electrodes 601d in the fourth domain D may be connected to one another by still another connecting portion.

The first sub-pixel electrode PE1 and the first storage electrode 751 may overlap each other. In an implementation, an edge portion of the first sub-pixel electrode PE1 may be on the first storage electrode 751.

As illustrated in FIG. 4, the second sub-pixel electrode PE2 is in the second sub-pixel area P2. In such an implementation, the second sub-pixel electrode PE2 is on the capping layer 391. The second sub-pixel electrode PE2 is connected to the second source electrode SE2 through the second contact hole CH2. The second sub-pixel electrode PE2 may include or be formed of a same material as that in the first sub-pixel electrode PE1. For example, the second sub-pixel electrode PE2 and the first sub-pixel electrode PE1 may be simultaneously formed in a same process.

The second sub-pixel electrode PE2 has substantially a same structure as that of the first sub-pixel electrode PE1. In an implementation, the second sub-pixel electrode PE2 includes a stem electrode which divides the second sub-pixel area P2 into a plurality of domains and a branch electrode extending from the stem electrode into each corresponding one of the domains. In addition, the second sub-pixel electrode PE2 may further include a first connecting portion and a second connecting portion. The stem electrode, the branch electrode, the first connecting portion, and the second connecting portion in the second sub-pixel electrode PE2 may be the same as those in the first sub-pixel electrode PE1.

The second sub-pixel electrode PE2 may have a larger area than or equal area relative to that of the first sub-pixel electrode PE1. In an implementation, the area of the second sub-pixel electrode PE2 may be one time to two times the area of the first sub-pixel electrode PE1.

The second sub-pixel electrode PE2 and the second storage electrode 752 may overlap each other. In an implementation, an edge portion of the second sub-pixel electrode PE2 may be on the second storage electrode 752.

As illustrated in FIGS. 1 and 4, the auxiliary gate electrode GE11 is on the capping layer 391 to overlap the second semiconductor layer 322, the second drain electrode DE2, and the second source electrode SE2. The auxiliary gate electrode GE11 and the gate line GL may be on different layers. The auxiliary gate electrode GE11 is connected to the gate line GL through the third contact holes H3 of the insulating layer (gate insulating layer 311), the passivation layer 320, the color filter 354, and the capping layer 391. The auxiliary gate electrode GE11 may include substantially a same material as that included in the aforementioned first sub-pixel electrode PE1. The auxiliary gate electrode GE11 and first sub-pixel electrode PE1 may be simultaneously formed in a same process.

The second switching element TFT2 is connected to the gate line GL through the auxiliary gate electrode GE11 which has a relatively large resistance. For example, a material (e.g., a transparent conductive material such as IZO) in the gate line GL and the first gate electrode GE1 has a greater resistance than that of a material (e.g., a metal material such as aluminum) in the auxiliary gate electrode GE11. Accordingly, the second switching element TFT has a greater inner resistance (e.g., a greater threshold voltage) than that of the first switching element TFT1 including the first gate electrode GE1 which has a unitary construction with the gate line GL. Accordingly, although a same gate signal is applied to the auxiliary gate electrode GE11 of the second switching element TFT2 and the first gate electrode GE1 of the first switching element TFT1, a voltage drop by the second switching element TFT2 may be larger than that by the first switching element TFT1. Accordingly, the first sub-pixel voltage and the second sub-pixel voltage may have different values from each other. For example, the second sub-pixel voltage is less than the first sub-pixel voltage. Accordingly, visibility of the pixel may be improved.

In an implementation, the auxiliary gate electrode GE11 may include substantially a same material as that in the gate line GL.

As illustrated in FIGS. 3 and 4, the light blocking layer 376 is on the second substrate 302. The light blocking layer 376 may be in a portion aside from the first and second sub-pixel areas P1 and P2. In an implementation, the light blocking layer 376 may be on the first substrate 301.

The overcoat layer 722 is on the light blocking layer 376. In such an implementation, the overcoat layer 722 may be on an entire surface of the second substrate 302 including the light blocking layer 376. The overcoat layer 722 may help significantly reduce (or minimize) a height difference among elements between the overcoat layer 722 and the second substrate 302, e.g., among elements of the second substrate 302 such as the aforementioned light blocking layer 376. In an implementation, the overcoat layer 722 may be omitted.

The common electrode 330 is on the overcoat layer 722. In such an implementation, the common electrode 330 may be on an entire surface of the second substrate 302 including the overcoat layer 722. In an alternative implementation, the common electrode 330 may be on portions of the overcoat layer 722 corresponding to the first sub-pixel area P1 and the second sub-pixel area P2. The common voltage Vcom may be applied to the common electrode 330. The common electrode 330 may include the aforementioned transparent conductive material (e.g., ITO or IZO).

An implementation of an LCD device may further include a first polarizer and a second polarizer. When a surface of the first substrate 301 and a surface of the second substrate 302 that face each other are defined as upper surfaces of the corresponding substrates, respectively, and surfaces opposite to the upper surfaces are defined as lower surfaces of the corresponding substrates, respectively, the aforementioned first polarizer is on the lower surface of the first substrate 301 and the second polarizer is on the lower surface of the second substrate 302.

A transmission axis of the first polarizer is perpendicular to a transmission axis of the second polarizer. One of the transmission axes thereof is oriented parallel to the gate line GL. In an alternative implementation, the LCD device may only include one of the first polarizer or the second polarizer.

An implementation of an LCD device may further include a shielding electrode. The shielding electrode may be on the capping layer 391 to overlap the data line DL. For example, the shielding electrode may have substantially a same shape as that of the data line DL and may be disposed along the data line DL. The shielding electrode may include or be formed of a same material as in the first sub-pixel electrode PE1. The common voltage Vcom may be applied to the shielding electrode. The shielding electrode may help prevent formation of an electric field between the data line DL and the sub-pixel electrode, for example, the first and second sub-pixel electrodes. In such an implementation, the shielding electrode and the common electrode 330 have an equivalent electric potential, such that light transmitted through the liquid crystal layer between the shielding electrode and the common electrode 330 is shielded by the second polarizer. Accordingly, light leakage may be significantly reduced or prevented at a portion corresponding to the data line DL.

The first substrate 301 and the second substrate 302 may be insulating substrates that include or are formed of glass or plastic. The liquid crystal layer between the first substrate 301 and the second substrate 302 include liquid crystal molecules. The liquid crystal molecules may have, for example, negative dielectric constants and may be homeotropic liquid crystal molecules.

Figure 6:
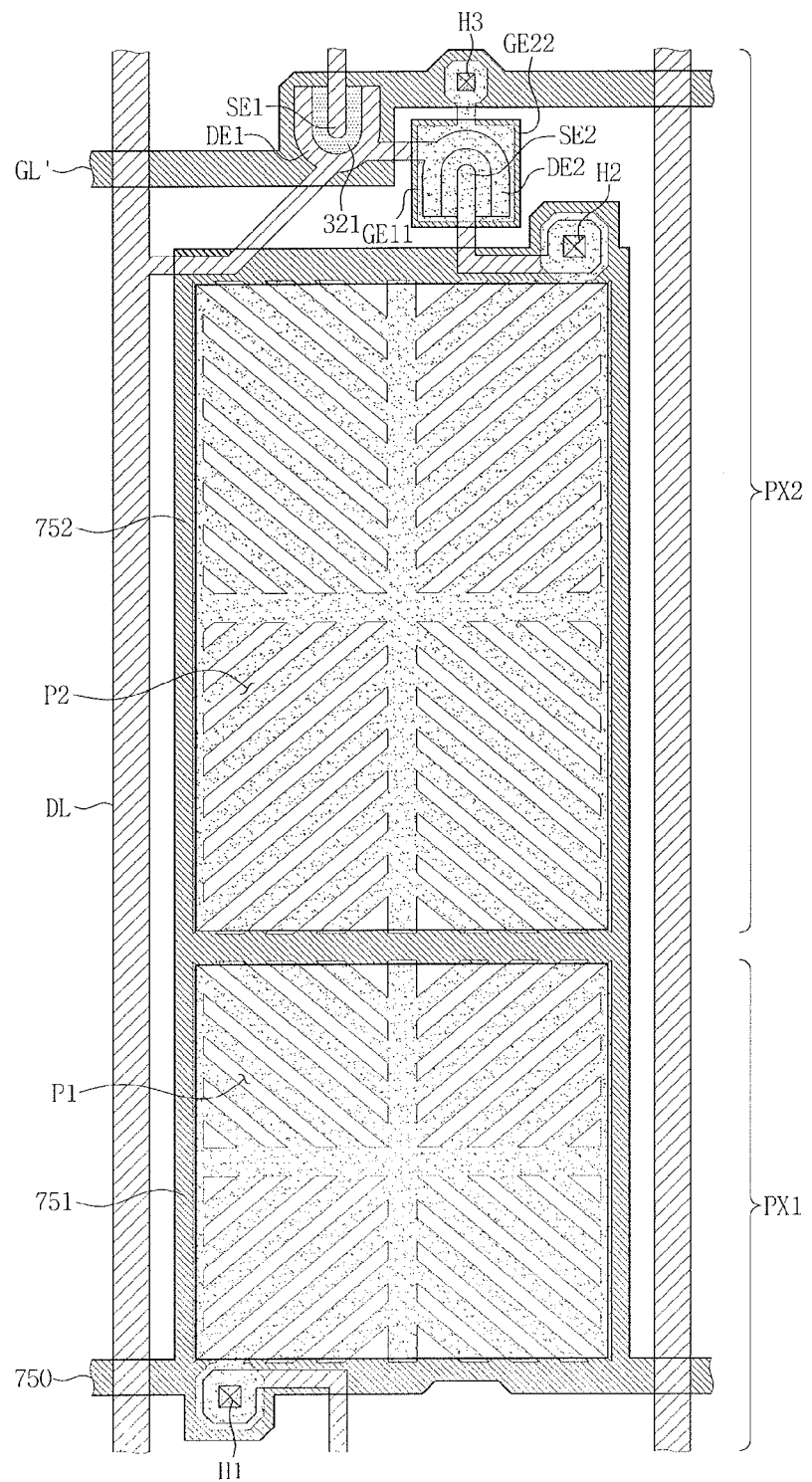
FIG. 6 illustrates two adjacent pixels each having the configuration of FIG. 2.

FIG. 6 illustrates two adjacent pixels having the configuration of FIG. 2. FIG. 6 illustrates a portion of the first pixel and a portion of the second pixel. In an implementation, the first pixel and the second pixel have a same structure as that of the pixel illustrated in FIG. 2.

As illustrated in FIG. 6, the first storage electrode 751 in the first pixel PX1 may be connected to the second storage electrode 752 in the second pixel PX2. For example, the first storage electrode 751 of the first pixel PX1 and the second storage electrode 752 of the second pixel PX2 may be connected to each other. The first pixel PX1 and the second pixel PX2 may be adjacent to each other between two adjacent ones GL and GL' of the gate lines. In such an implementation, the first storage electrode 751 of the first pixel PX1 and the second storage electrode 752 of the second pixel PX2 may have a unitary construction.

Figure 7:
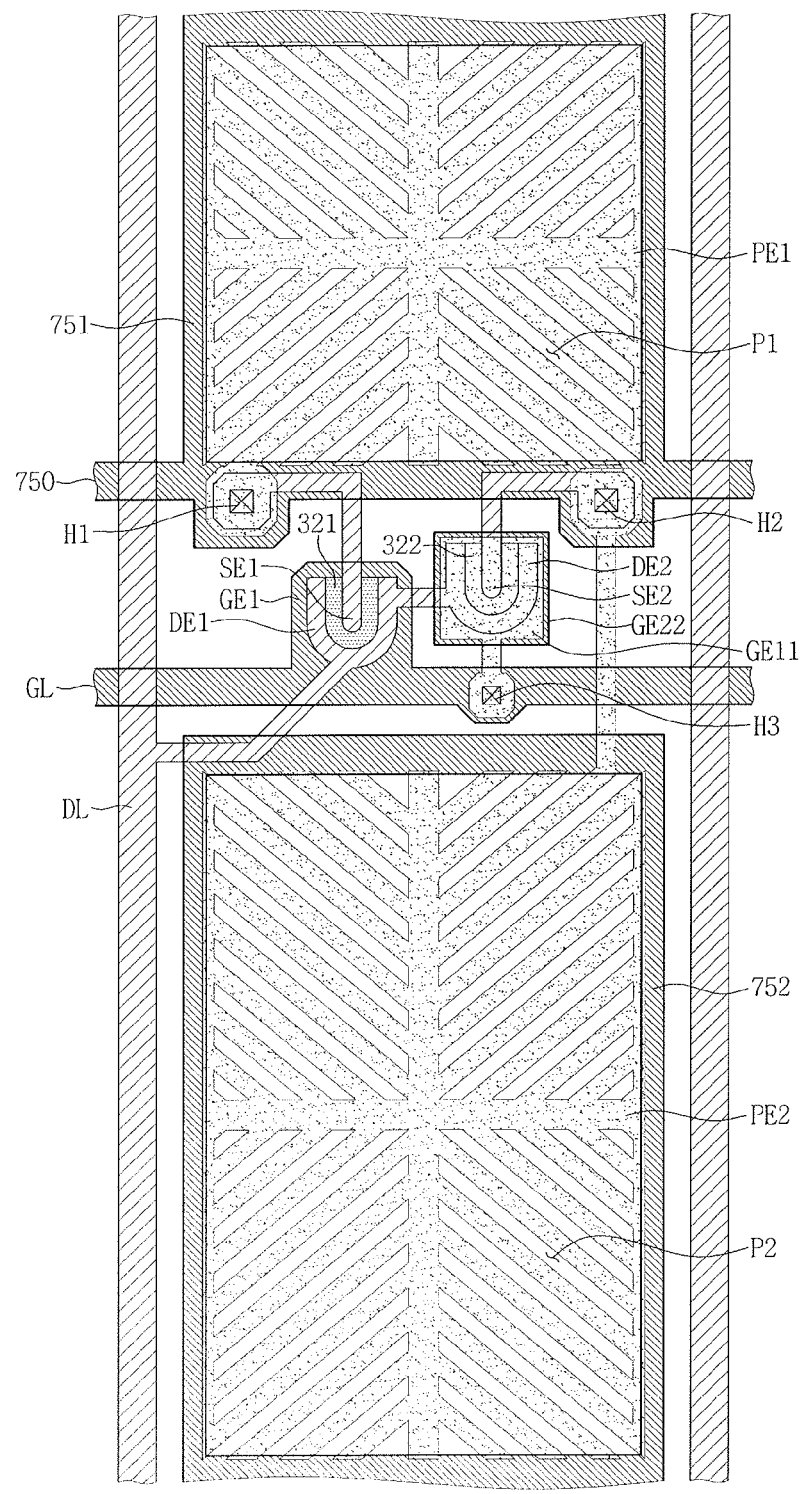
FIG. 7 illustrates a plan view of another implementation of an LCD device including a pixel configuration corresponding to the pixel circuit of FIG. 1.

FIG. 7 illustrates a plan or layout view of another implementation of an LCD device including a pixel configuration corresponding to the pixel circuit of FIG. 1. As illustrated in FIG. 7, the second drain electrode DE2 may have a predetermined shape, e.g. a U-like shape. In such an implementation, a convex portion of the second drain electrode DE2 faces the second sub-pixel electrode PE2. The second drain electrode DE2 is between the storage line 750 and the gate line GL.

Descriptions pertaining to other configurations illustrated in FIG. 7 will make reference to descriptions pertaining to configurations illustrated in FIGS. 3 and 4.

Figure 8:
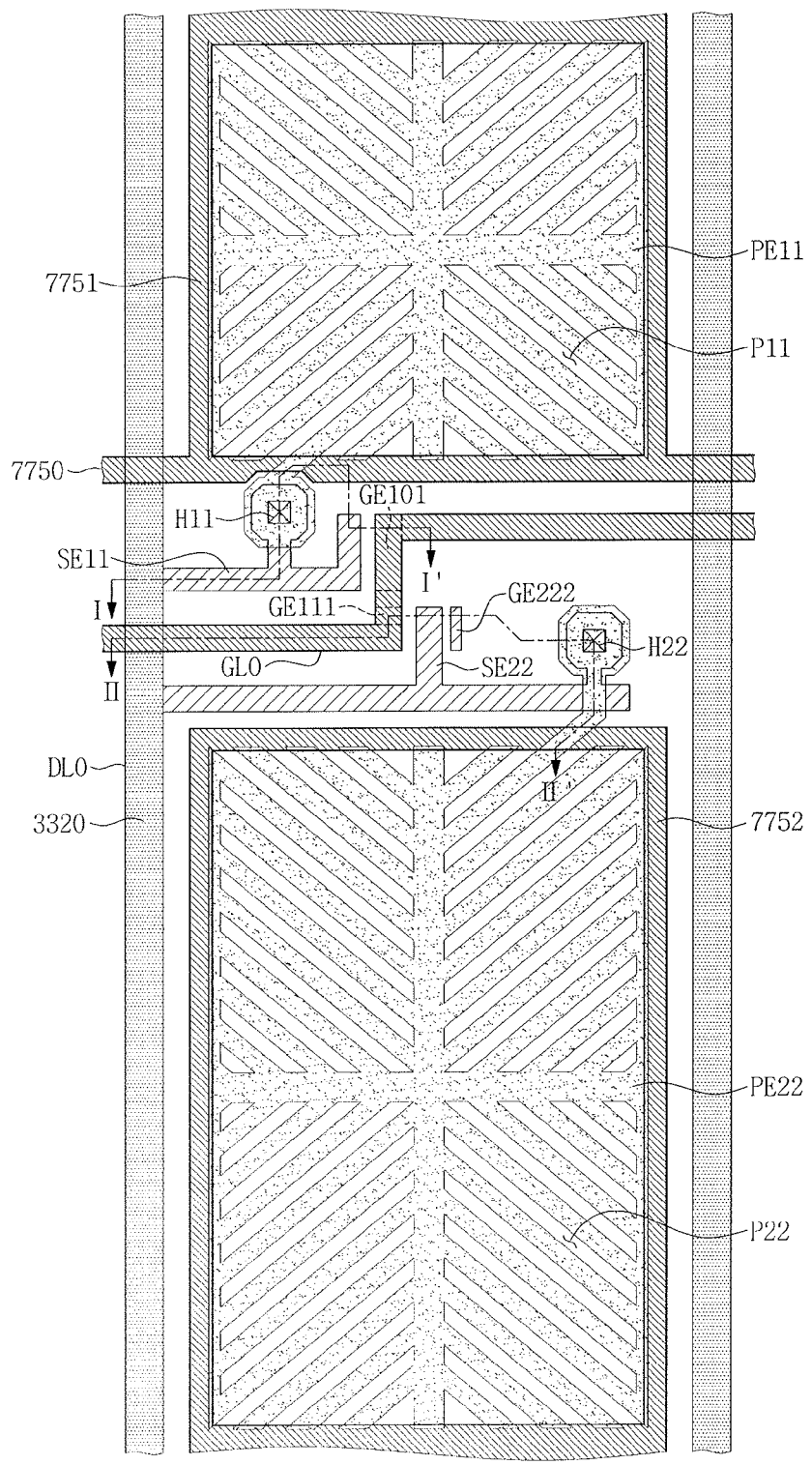
FIG. 8 illustrates a plan view of still another implementation of an LCD device including a pixel configuration corresponding to the pixel circuit of FIG. 1.
Figure 9:
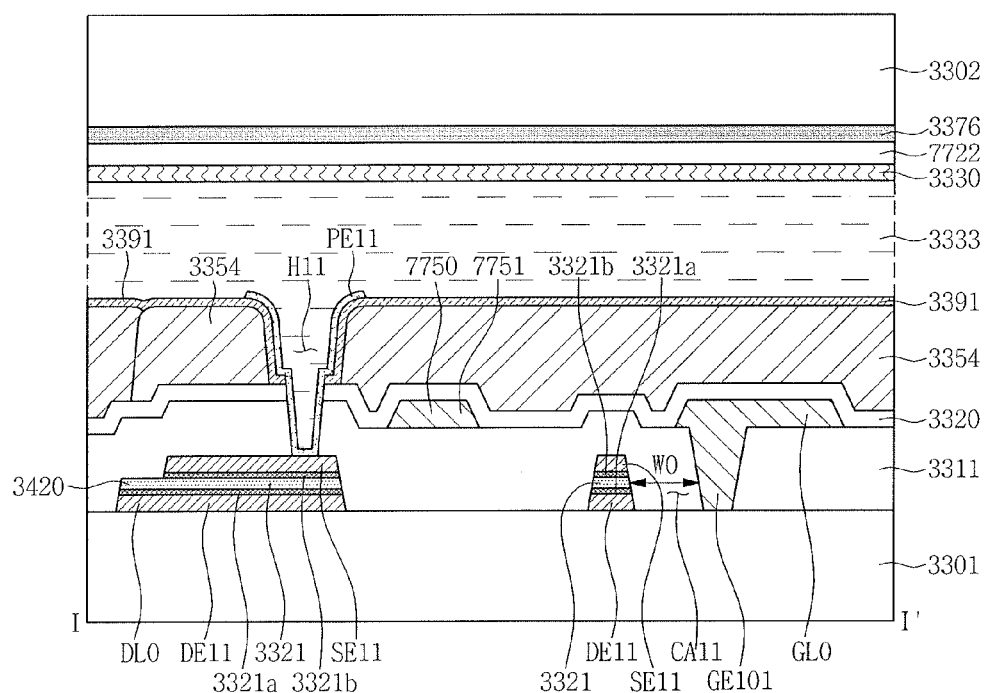
FIG. 9 illustrates a cross-sectional view taken along line I-I' of FIG. 8.
Figure 10:
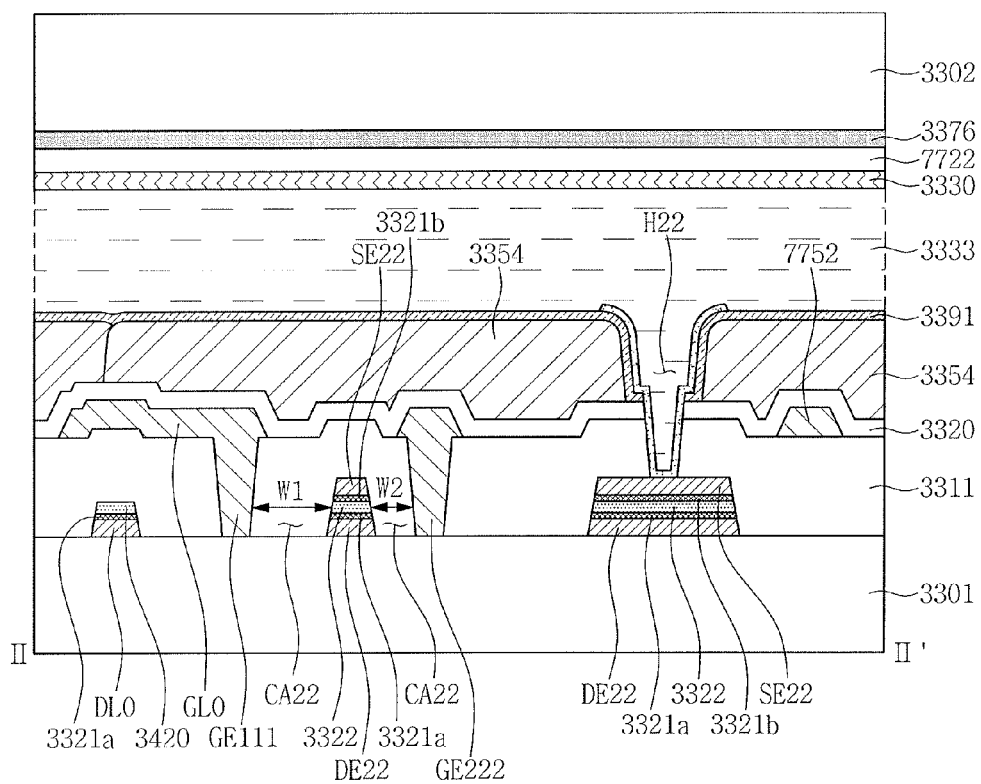
FIG. 10 illustrates a cross-sectional view taken along line II-II' of FIG. 8.

FIG. 8 illustrates a plan or layout view of another implementation of an LCD device including a pixel configuration corresponding to the pixel circuit of FIG. 1. FIG. 9 illustrates a cross-sectional view taken along line I-I' of FIG. 8. FIG. 10 illustrates a cross-sectional view taken along line II-II' of FIG. 8.

As illustrated in FIGS. 8, 9, and 10, the LCD device includes a first substrate 3301, a gate line GL0, a first gate electrode GE101, a main gate electrode GE222, an auxiliary gate electrode GE111, a first storage electrode 7751, a storage line 7750, a second storage electrode 7752, a gate insulating layer 3311, a first semiconductor layer 3321, a second semiconductor layer 3322, a first ohmic contact layer 3321a, a second ohmic contact layer 3321b, a data line DL0, a first drain electrode DE11, a first source electrode SE11, a second drain electrode DE22, a second source electrode SE22, a passivation layer 3320, a capping layer 3391, a color filter 3354, a first sub-pixel electrode PE11, a second sub-pixel electrode PE22, a second substrate 3302, a light blocking layer 3376, an overcoat layer 7722, a common electrode 3330, and a liquid crystal layer 3333. In an implementation, at least one of the first ohmic contact layer 3321a, the second ohmic contact layer 3321b, or the overcoat layer 7722 may be omitted.

As illustrated in FIGS. 8 and 9, the first switching element TFT11 includes the first gate electrode GE101, the first semiconductor layer 3321, the first drain electrode DE11, and the first source electrode SE11. As illustrated in FIG. 9, the first drain electrode DE11, the first semiconductor layer 3321, and the first source electrode SE11 have a vertically stacked structure. For example, the first semiconductor layer 3321 is on the first drain electrode DE11, and the first source electrode SE11 is on the first semiconductor layer 3321.

The first ohmic contact layer 3321a may also be between the first drain electrode DE11 and the first semiconductor layer 3321. The second ohmic contact layer 3321b may also be between the first semiconductor layer 3321 and the first source electrode SE11. In such an implementation, the first drain electrode DE11, the first ohmic contact layer 3321a, the first semiconductor layer 3321, the second ohmic contact layer 3321b, and the first source electrode SE11 have a vertically stacked structure.

The first gate electrode GE101 of the first switching element TFT11 is adjacent to the first semiconductor layer 3321. For example, as illustrated in FIGS. 8 and 9, the first gate electrode GE101 and the first semiconductor layer 3321 are horizontally adjacent to each other. For example, the first gate electrode GE101 horizontally overlaps the first semiconductor layer 3321. The first gate electrode GE101 may further overlap at least one of the first drain electrode DE11, the first ohmic contact layer 3321a, the second ohmic contact layer 3321b, or the first source electrode SE11.

FIG. 9 illustrates an example in which the first gate electrode GE101 further overlaps the first drain electrode DE11, the first ohmic contact layer 3321a, the first semiconductor layer 3321, the second ohmic contact layer 3321b, and the first source electrode SE11, horizontally. In an example illustrated in FIG. 9, a portion of the first gate electrode GE101 is on a same layer as a layer on which the first drain electrode DE11 is disposed. Another portion of the first gate electrode GE101 is on a same layer as a layer on which the first ohmic contact layer 3321a is disposed. Another portion of the first gate electrode GE101 is on a same layer as a layer on which the first semiconductor layer 3321 is disposed. Another portion of the first gate electrode GE101 is on a same layer as a layer on which the second semiconductor layer 3321b is disposed. And, another portion of the first gate electrode GE101 is on a same layer as a layer on which the first source electrode SE11 is disposed.

As illustrated in FIGS. 8, 9, and 10, the second switching element TFT22 includes the main gate electrode GE222, the auxiliary gate electrode GE111, the second semiconductor layer 3322, the second drain electrode DE22, and the second source electrode SE22. As illustrated in FIG. 9, the second drain electrode DE22, the second semiconductor layer 3322, and the second source electrode SE22 have a vertically stacked structure. For example, the second semiconductor layer 3322 is on the second drain electrode DE22, and the second source electrode SE22 is on the second semiconductor layer 3322.

A third ohmic contact layer 3322a may also be between the second drain electrode DE22 and the second semiconductor layer 3322. A fourth ohmic contact layer 3322b may also be between the second semiconductor layer 3322 and the second source electrode SE22. In such an implementation, the second drain electrode DE22, the third ohmic contact layer 3322a, the second semiconductor layer 3322, the fourth ohmic contact layer 3322b, and the second source electrode SE22 have a vertically stacked structure.

The main gate electrode GE222 of the second switching element TFT22 is adjacent to the second semiconductor layer 3322. For example, as illustrated in FIGS. 8 and 10, the main gate electrode GE222 and the second semiconductor layer 3322 are horizontally adjacent to each other. For example, the main gate electrode GE222 horizontally overlaps the second semiconductor layer 3322. The main gate electrode GE222 may also overlap at least one of the second drain electrode DE22, the first ohmic contact layer 3321a, the second ohmic contact layer 3321b, or the second source electrode SE22 horizontally.

FIG. 10 illustrates an example in which the main gate electrode GE222 horizontally overlaps the second drain electrode DE22, the first ohmic contact layer 3321a, the second semiconductor layer 3322, the second ohmic contact layer 3321b, and the second source electrode SE22. In the example illustrated in FIG. 10, a portion of the main gate electrode GE222 is on a same layer as a layer on which the second drain electrode DE22 is disposed. Another portion of the man gate electrode GE222 is on a same layer as a layer on which the first ohmic contact layer 3321a is disposed. Another portion of the main gate electrode GE222 is on a same layer as a layer on which the second semiconductor layer 3322 is disposed. Another portion of the main gate electrode GE222 is on a same layer as a layer on which the second ohmic contact layer 3321b is disposed. Another portion of the main gate electrode GE222 is on a same layer as a layer on which the second source electrode SE22 is disposed.

The auxiliary gate electrode GE111 of the second switching element TFT22 is adjacent to the second semiconductor layer 3322. For example, as illustrated in FIGS. 8 and 10, the auxiliary gate electrode GE111 and the second semiconductor layer 3322 are horizontally adjacent to each other. For example, the auxiliary gate electrode GE111 horizontally overlaps the second semiconductor layer 3322. The auxiliary gate electrode GE111 may also overlap at least one of the second drain electrode DE22, the first ohmic contact layer 3321a, the second ohmic contact layer 3321b, and the second source electrode SE22 horizontally.

FIG. 10 illustrates an example in which the auxiliary gate electrode GE111 horizontally overlaps the second drain electrode DE22, the first ohmic contact layer 3321a, the second semiconductor layer 3322, the second ohmic contact layer 3321b, and the second source electrode SE22. In the example illustrated in FIG. 10, a portion of the auxiliary gate electrode GE111 is on a same layer as a layer on which the second drain electrode DE22 is disposed. Another portion of the auxiliary gate electrode GE111 is on a same layer as a layer on which the first ohmic contact layer 3321a is disposed. Another portion of the auxiliary gate electrode GE111 is on a same layer as a layer on which the second semiconductor layer 3322 is disposed. Another portion of the auxiliary gate electrode GE111 is on a same layer as a layer on which the second ohmic contact layer 3321b is disposed. Another portion of the auxiliary gate electrode GE111 is on a same layer as a layer on which the second source electrode SE22 is disposed.

The main gate electrode GE222 does not physically contact any conductor including the gate line GL0. In an alternative implementation, the main gate electrode GE222 may be connected to the aforementioned bias line.

In a channel area CA22 of the second switching element TFT22, the distance between the second semiconductor layer 3322 and the auxiliary gate electrode GE111 of the second switching element TFT22 may correspond to a first distance W1 and the distance between the second semiconductor layer 3322 and the main gate electrode GE222 thereof may correspond to a second distance W2. The first distance W1 is longer than the second distance W2. Accordingly, when receiving a gate high voltage through the auxiliary gate electrode GE111, rather than through the main gate electrode GE222, the second switching element TFT22 exhibits relatively lower current driving capability. As illustrated in FIGS. 8 and 10, since connected to the gate line GL0 through the auxiliary gate electrode GE11, the second switching element TFT2 has relatively lower current driving capability.

A distance (hereinafter, a first distance) between the first gate electrode GE101 of the first switching element TFT1 and the first semiconductor layer 3321 of the first switching element TFT1 at the channel area CA11 of the first switching element TFT1 is defined as W0. A distance (hereinafter, a second distance) between the auxiliary gate electrode GE111 of the second switching element TFT2 and the second semiconductor layer 3322 of the second switching element TFT2 at the channel area CA22 of the second switching element TFT2 is defined as W1. The first distance W0 is different from the second distance W1. For example, the second distance W1 may be greater than the first distance W0.

As illustrated in FIGS. 9 and 10, the data line DL0, the first drain electrode DE11, and the second drain electrode DE22 are on the first substrate 3301. The data line DL0, the first drain electrode DE11, and the second drain electrode DE22 respectively include same materials as materials in the aforementioned exemplary embodiment of the data line DL, the first drain electrode DE1, and the second drain electrode DE2, respectively.

As illustrated in FIGS. 9 and 10, the first ohmic contact layer 3321a is on the data line DL0, the first drain electrode DE11, and the second drain electrode DE22. The first ohmic contact layer 3321a on the data line DL0, the first ohmic contact layer 3321a on the first drain electrode DE11, and the first ohmic contact layer 3321a on the second drain electrode DE22 are connected to one another. The first ohmic contact layer 3321a may include substantially a same material as that in the aforementioned implementation of the first ohmic contact layer 321a.

As illustrated in FIGS. 9 and 10, a semiconductor layer 3420 is on the first ohmic contact layer 3321a. The data line DL0, the first ohmic contact layer 3321a, and the first semiconductor layer 3321 may have substantially the same shape.

The semiconductor layer 3420 includes the first semiconductor layer 3321 and the second semiconductor layer 3322. For example, the first semiconductor layer 3321 and the second semiconductor layer 3322 are portions of the semiconductor layer 3420. For example, a portion of the semiconductor layer 3420 between the first drain electrode DE11 and the first source electrode SE11 may correspond to the first semiconductor layer 3321. In addition, a portion of the semiconductor layer 3420 between the second drain electrode DE22 and the second source electrode SE22 may correspond to the aforementioned second semiconductor layer 3322. The semiconductor layer 3420 including the first semiconductor layer 3321 and the second semiconductor layer 3322 may include substantially a same material as in the aforementioned implementation of the first semiconductor layer 321.

As illustrated in FIGS. 9 and 10, the second ohmic contact layer 3321b is on the first semiconductor layer 3321 and the second semiconductor layer 3322. For example, the second ohmic contact layer 3321b does not overlap the data line DL0. Accordingly, the second ohmic contact layer 3321b on the first semiconductor layer 3321 and the second ohmic contact layer 3321b on the second semiconductor layer 3322 are physically separated from each other. The second ohmic contact layer 3321b may include substantially a same material as in the aforementioned implementation of the second ohmic contact layer 321b.

The first source electrode SE11 and the second source electrode SE22 are on the second ohmic contact layer 3321b. For example, the first source electrode SE11 is on the second ohmic contact layer 3321b to overlap the first semiconductor layer 3321. The second source electrode SE22 is on the second ohmic contact layer 3321b to overlap the second semiconductor layer 3322. The first source electrode SE11 and the second source electrode SE22 are physically separated from each other. The first source electrode SE11 and the second source electrode SE22 may respectively include same materials as in the aforementioned implementation of the first source electrode SE1 and the second source electrode SE2, respectively.

As illustrated in FIGS. 9 and 10, the gate insulating layer 3311 is on the first substrate 3301, the semiconductor layer 3420, the first source electrode SE11, and the second source electrode SE22. The gate insulating layer 3311 is over an entire surface of the first substrate 3301 including the semiconductor layer 3420, the first source electrode SE11, and the second source electrode SE22. The gate insulating layer 3311 has first, second, third, fourth, and fifth holes. In such an implementation, the first hole of the gate insulating layer 3311 is on the first source electrode SE11, the second hole of the gate insulating layer 3311 is on the second source electrode SE22, and third, fourth, and fifth holes are on the first substrate 3301. The gate insulating layer 3311 may include substantially a same material as in the aforementioned gate insulating layer 311.

The gate line GL1, the first storage electrode 7751, the second storage electrode 7752, and the storage line 7750 are on the gate insulating layer 3311. Respective shapes of the gate line GL1, the first storage electrode 7751, the second storage electrode 7752, and the storage line 7750 may be the same as in the aforementioned implementation of the gate line GL, the first storage electrode 751, the second storage electrode 752, and the storage line 750. The gate line GL1, the first storage electrode 7751, the second storage electrode 7752, and the storage line 7750 may respectively include the same materials as in the aforementioned implementation of the gate line GL, the first storage electrode 751, the second storage electrode 752, and the storage line 750, respectively.

As illustrated in FIGS. 9 and 10, the first gate electrode GE101, the main gate electrode GE222, and the auxiliary gate electrode GE111 perpendicularly extend from the gate line GL0 toward the first substrate 3301. The first gate electrode GE101 is in the third hole of the gate insulating layer 3311, the main gate electrode GE222 in the fourth hole of the gate insulating layer 3311, and the auxiliary gate electrode GE111 in the fifth hole of the gate insulating layer 3311. The first gate electrode GE101 may fill the entirety of the third hole. The main gate electrode GE222 may fill the entirety of the fourth hole. The auxiliary gate electrode GE111 may fill the entirety of the fifth hole. The first gate electrode GE101, the main gate electrode GE222, and the auxiliary gate electrode GE111 may respectively include same materials as those in the aforementioned implementation of the first gate electrode GE1, the main gate electrode GE22, and the auxiliary gate electrode GE11, respectively.

In the channel area CA22 of the second switching element, the width W1 of the gate insulating layer 3311 between the second semiconductor layer 3322 and the auxiliary gate electrode GE11 is larger than the width W2 of the gate insulating layer 3311 between the second semiconductor layer 3322 and the main gate electrode GE222.

The passivation layer 3320 is on the gate insulating layer 3311, the gate line GL0, the first storage electrode 7751, the second storage electrode 7752, the storage line 7750, the first gate electrode GE101, the main gate electrode GE222, and the auxiliary gate electrode GE111. The passivation layer 3320 is over the entire surface of the first substrate 3301 including the gate insulating layer 3311, the gate line GL0, the first storage electrode 7751, the second storage electrode 7752, the storage line 7750, the first gate electrode GE101, the main gate electrode GE222, and the auxiliary gate electrode GE111. The passivation layer 3320 has a first hole and a second hole. In such an implementation, the first hole of the passivation layer 3320 is above the first hole of the gate insulating layer 3311. The second hole of the passivation layer 3320 is above the second hole of the gate insulating layer 3311. The passivation layer 3320 may include substantially a same material as in the aforementioned implementation of the passivation layer 320.

As illustrated in FIGS. 9 and 10, the color filter 3354 is on the passivation layer 3320. The color filter 3354 is in a first sub-pixel area P11 and a second sub-pixel area P22. In such an implementation, an edge portion of the color filter 3354 is on the data line DL0. An edge portion of one of the color filters 3354 may overlap an edge portion of another of the color filters 3354 adjacent thereto. Color filters 3354 having a same color are respectively disposed in the first sub-pixel area P11 and the second sub-pixel area P22 in a single pixel. The color filter 3354 has a first hole and a second hole. In such an implementation, the first hole of the color filter 3354 is above the first hole of the passivation layer 3320. The second hole of the color filter 3354 is above the second hole of the passivation layer 3320. The color filter 3354 may include substantially a same material as in the color filter 354.

As illustrated in FIGS. 9 and 10, the capping layer 3391 is on the color filter 3354 and helps reduce or prevent infiltration of impurities, generated from the color filter 3354, into the liquid crystal layer 3333. The capping layer 3391 has a first hole and a second hole. In such an implementation, the first hole of the capping layer 3391 is above the first hole of the color filter 3354. The second hole of the capping layer 3391 is above the second hole of the color filter 3354. The capping layer 3391 may include substantially a same material as in the aforementioned implementation of the capping layer 391.

A first contact hole H11 includes the first hole of the passivation layer 3320, the first hole of the color filter 3354, and the first hole of the capping layer 3391. A portion of the first source electrode SE11 is exposed through the first contact hole H11. As previously described, the sizes of the holes of the first contact hole H11 increase in an upward direction.

A second contact hole H22 includes the second hole of the passivation layer 3320, the second hole of the color filter 3354, and the second hole of the capping layer 3391. A portion of the second source electrode SE22 is exposed through the second contact hole H22. As previously described, the size of the holes of the second contact hole H22 increase in an upward direction.

The distance W1 between the channel area CA22 and the auxiliary gate electrode GE111 of the second switching element TFT22 may be longer than the distance W2 between the channel area CA22 and the main gate electrode GE22 thereof. To this end, the gate insulating layer 3311 between the channel area CA22 and the auxiliary gate electrode GE111 may have a larger width than that of the gate insulating layer 3311 between the channel area CA22 and the main gate electrode GE222.

As illustrated in FIG. 9, the first sub-pixel electrode PE11 is in the first sub-pixel area P11. In such an implementation, the first sub-pixel electrode PE11 is on the capping layer 3391. The first sub-pixel electrode PE11 is connected to the first source electrode SE11 through the first contact hole H11. The first sub-pixel electrode PE1 may be substantially the same as the aforementioned implementation of the first sub-pixel electrode PE1.

As illustrated in FIG. 10, the second sub-pixel electrode PE22 is in the second sub-pixel area P22. In such an implementation, the second sub-pixel electrode PE22 is on the capping layer 3392. The second sub-pixel electrode PE22 is connected to the second source electrode SE22 through the second contact hole H22. The second sub-pixel electrode PE22 may be substantially the same as the aforementioned implementation of the second sub-pixel electrode PE2.

In an alternative implementation of the light blocking layer 3376, the overcoat layer 7722, the common electrode 3330, and the liquid crystal layer 3333 may be substantially the same as the aforementioned implementation of the light blocking layer 376, the overcoat layer 722, the common electrode 330, and the liquid crystal layer 333.

In an alternative implementation of the LCD device may further include the aforementioned shielding electrode.

FIGS. 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, and 24B illustrate cross-sectional views of embodiments of methods for manufacturing the LCD device of FIGS. 3 and 4. FIGS. 11A, 12A, 13A, 14A, 15A, 16A, 17A, 18A, 19A, 20A, 21A, 22A, 23A, and 24A illustrate cross-sectional views of an embodiment of a method for manufacturing the LCD device of FIG. 3, and FIGS. 11B, 12B, 13B, 14B, 15B, 16B, 17B, 18B, 19B, 20B, 21B, 22B, 23B, and 24B illustrate cross-sectional views of an embodiment of a method for manufacturing the LCD device of FIG. 4.

Figure 11A:
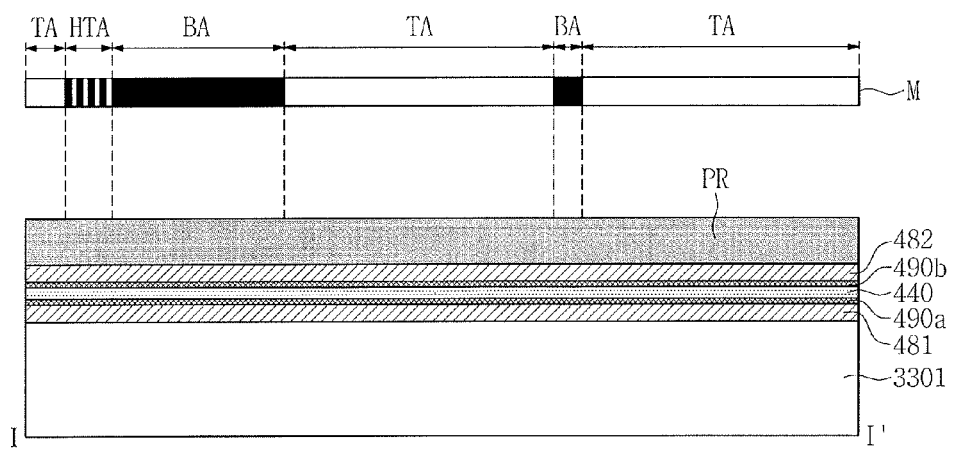
FIGS. 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, and 24B illustrate cross-sectional views of a process of manufacturing the LCD device of FIGS. 3 and 4.
Figure 11B:
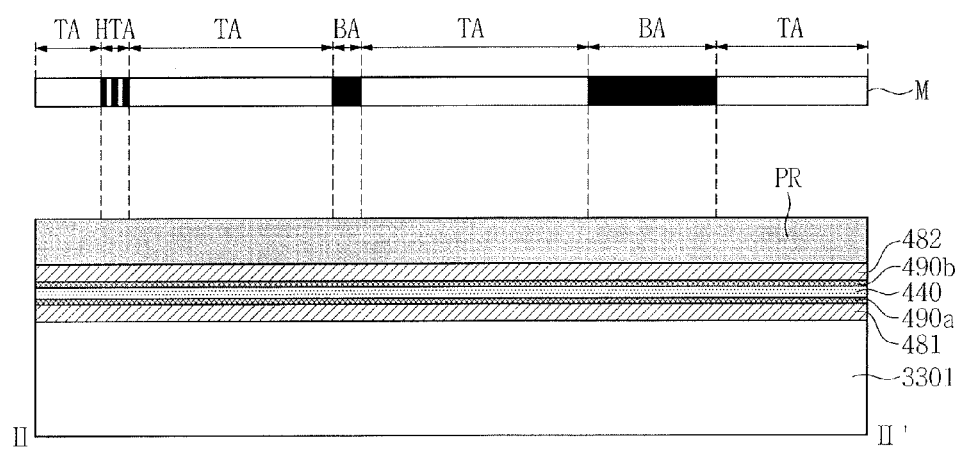
Figure 12A:
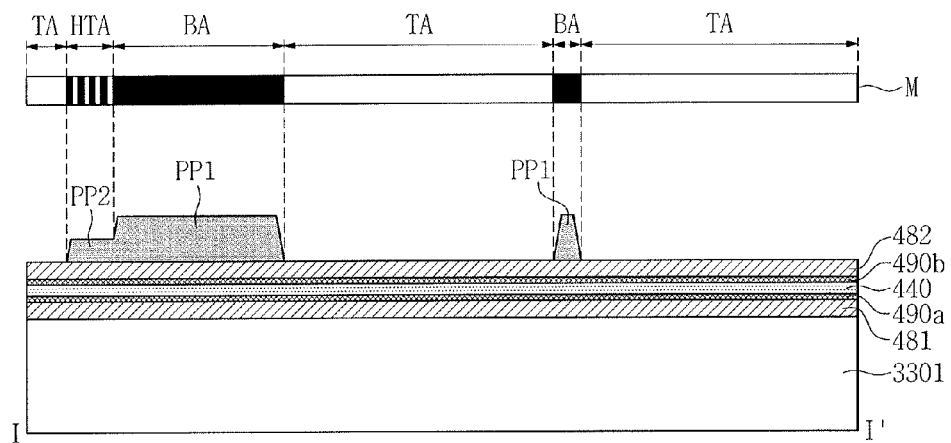
Figure 12B:
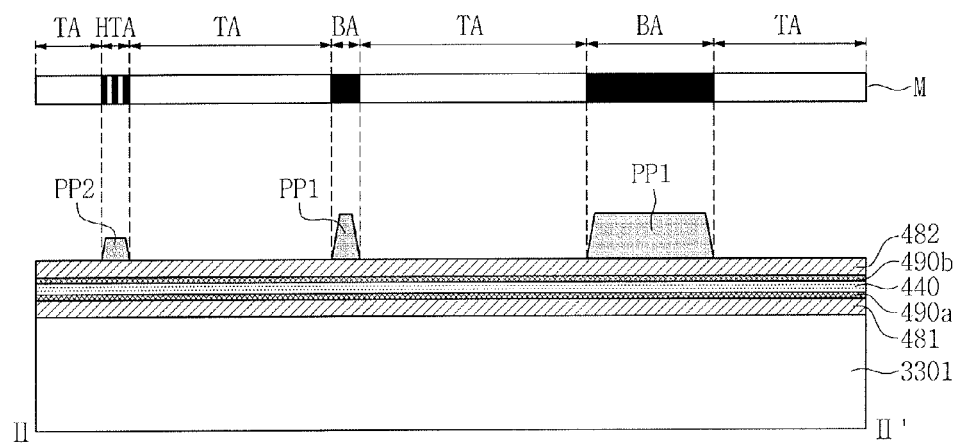

As illustrated in FIGS. 11A and 11B, a first metal layer 481, a first impurity semiconductor material layer 490a, a semiconductor material layer 440, a second impurity semiconductor material layer 490b, and a second metal layer 482 are sequentially deposited over an entire surface of a first substrate 3301.

The first metal layer 481 and the second metal layer 482 may be deposited in a physical vapor deposition (PVD) method, e.g., sputtering. The first impurity semiconductor material layer 490a, the semiconductor material layer 440, and the second impurity semiconductor material layer 490b may be deposited in a chemical vapor deposition (CVD) method.

The first metal layer 481 and the second metal layer 482 may include substantially a same material as in the aforementioned data line DL0, the first and second impurity semiconductor material layers 490a and 490b may include substantially a same material as in the first ohmic contact layer 3321a, and the semiconductor material layer 440 may include substantially a same material as in the first semiconductor layer 3321.

Subsequently, a photoresist PR is coated over an entire surface of the first substrate 3301 including the first metal layer 481, the first impurity semiconductor material layer 490a, the semiconductor material layer 440, the second impurity semiconductor material layer 490b, and the second metal layer 482.

Subsequently, a mask M is disposed on the photoresist PR. The mask M includes a transmissive area TA which transmits light, a blocking area BA which blocks light, and a half-transmissive area HTA which partially transmits light. The half-transmissive area HTA may include a plurality of slits or a semi-transparent layer. In such an implementation, the transmittance of the half-transmissive area HTA is higher than that of the light blocking area BA and lower than that of the transmissive area TA.

Subsequently, light (e.g., ultraviolet light) is selectively irradiated to the photoresist PR through the mask M such that the photoresist PR is exposed. When the exposed photoresist PR is developed, a first photoresist pattern PP1 and a second photoresist pattern PP2, having different thicknesses from each other, are formed on the second metal layer 482 as in FIGS. 12A and 12B.

The first photoresist pattern PP1 is on the second metal layer 482, corresponding to the light blocking area BA of the mask M, and the second photoresist pattern PP2 is on the second metal layer 482, corresponding to the half-transmissive area HTA of the mask M. In an implementation, a portion of the photoresist PR corresponding to the transmissive area TA of the mask M is completely removed. The thickness of the second photoresist pattern PP2 may be less than the thickness of first photoresist pattern PP1.

Figure 13A:
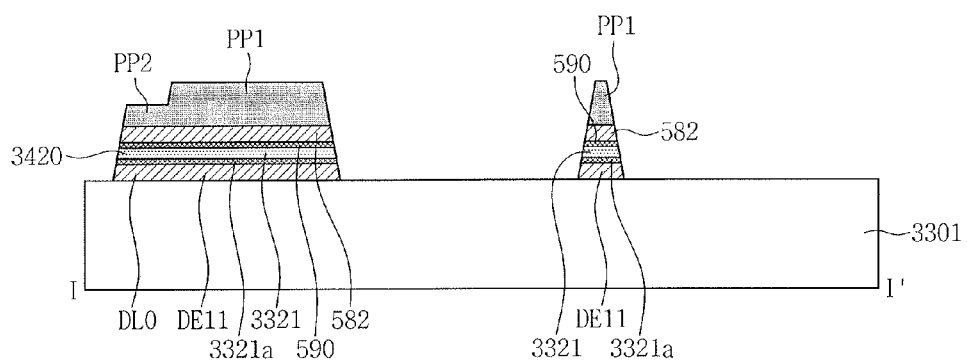
Figure 13B:
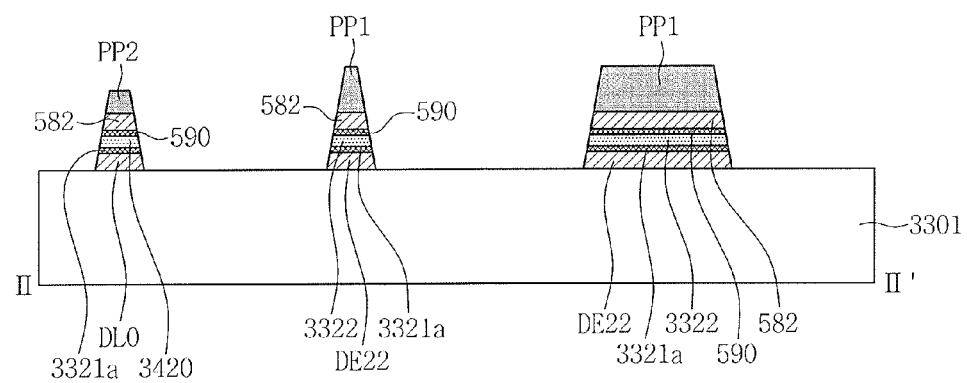

Subsequently, when the first and second photoresist patterns PP1 and PP2 are used as a mask, the second metal layer 482, the second impurity semiconductor material layer 490b, the semiconductor material layer 440, the first impurity semiconductor material layer 490a, and the first metal layer 481 are sequentially etched. In such an implementation, as illustrated in FIGS. 13A and 13B, a data line DL0, a first drain electrode DE11, and a second drain electrode DE22 are formed on the first substrate 3301. In addition, a first ohmic contact layer 3321a is formed on the data line DL0, the first drain electrode DE11, and the second drain electrode DE22. In addition, a semiconductor layer 3420 including first and second semiconductor layers 3321 and 3322 is formed on the first ohmic contact layer 3321a. In addition, an impurity semiconductor pattern 590 is formed on the semiconductor layer 3420, and a source metal layer 582 is formed on the impurity semiconductor pattern 590.

The first and second metal layers 481 and 482 may be removed in a wet-etching method using an etching solution. The first impurity semiconductor material layer 490a, the semiconductor material layer 440, and the second impurity semiconductor material layer 490b may be removed in a dry-etching method using an etching gas.

Figure 14A:
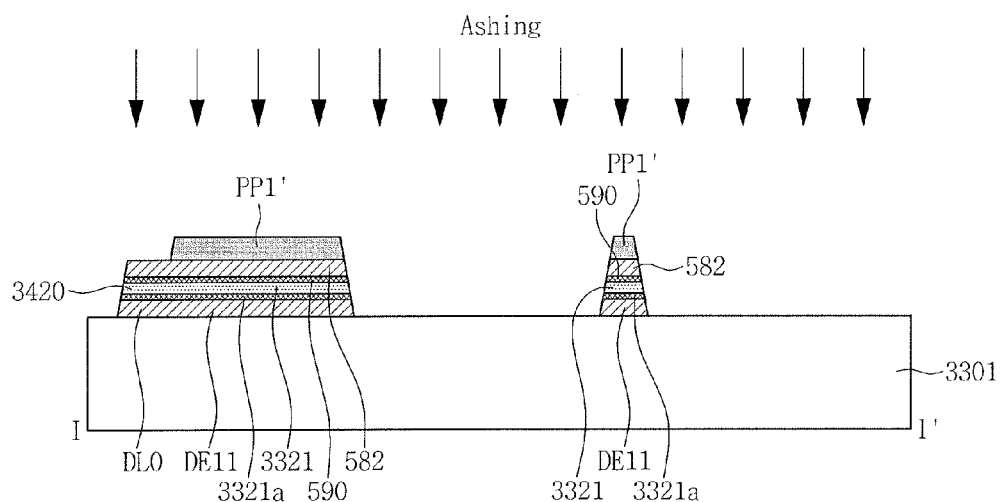
Figure 14B:
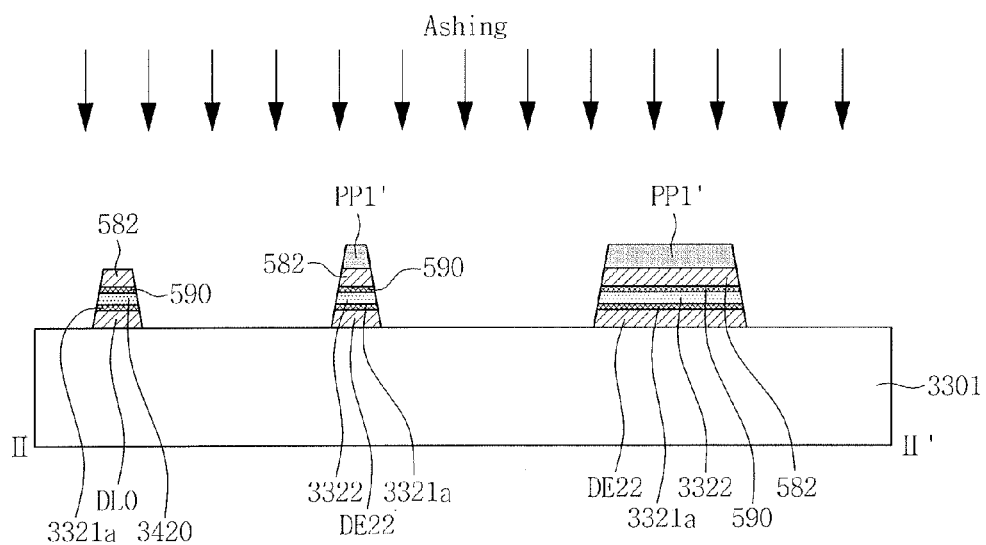

Subsequently, an ashing process is performed, for example, as illustrated in FIGS. 14A and 14B. In the ashing process, the first photoresist pattern PP1 and the second photoresist pattern PP2 are ashed by substantially the same extent. In such an implementation, the ashing process is performed until the second photoresist pattern PP2 having a relatively small thickness is removed. For example, when the second photoresist pattern PP2 is removed, the ashing process ends.

As the second photoresist pattern PP2 is removed, the source metal layer 582 therebelow is exposed. In an implementation, a portion of the first photoresist pattern PP1 is removed through the ashing process. Accordingly, the thickness of the first photoresist pattern PP1 is reduced. The ashed first photoresist pattern PP1 may be defined as a residual pattern PP1'.

Figure 15A:
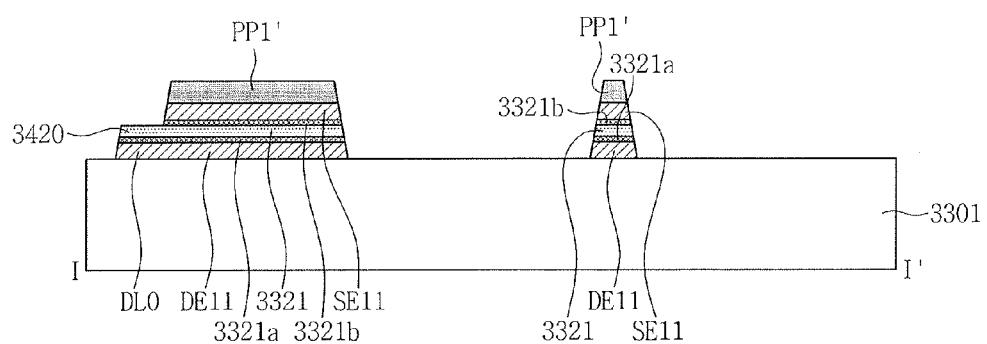
Figure 15B:
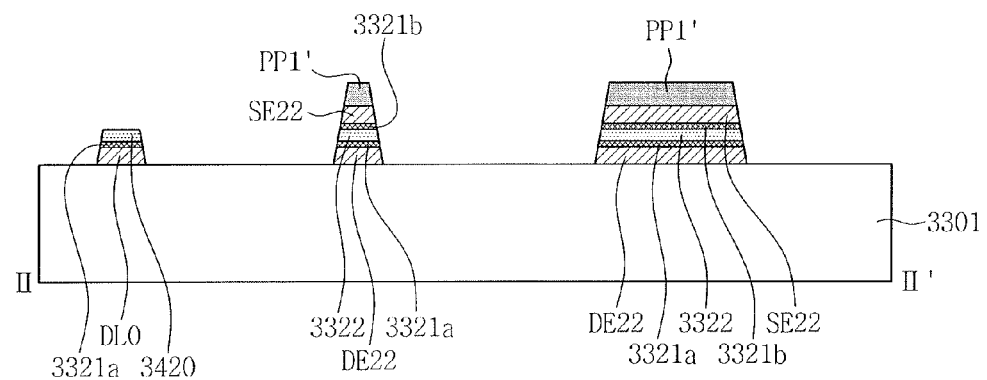

Subsequently, when the residual pattern PP1' is used as a mask, the source metal layer 582 and the impurity semiconductor pattern 590 therebelow are sequentially patterned through an etching process such that a second ohmic contact layer 3321b, a first source electrode SE11, and a second source electrode SE22 are formed as in FIGS. 15A and 15B.

In an implementation, in the etching process performed on the aforementioned impurity semiconductor pattern 590, a portion of the semiconductor layer 3420 below the impurity semiconductor pattern 590 is removed.

Figure 16A:
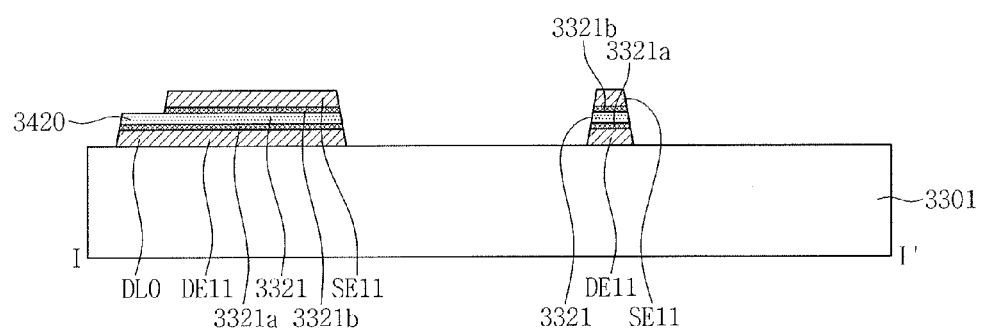
Figure 16B:
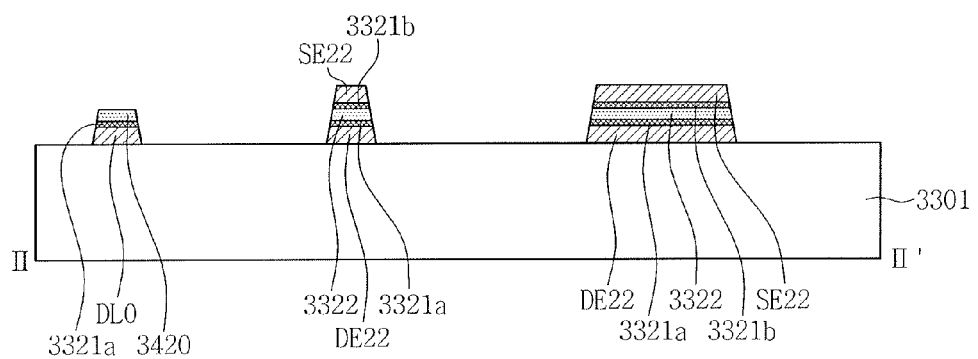

Subsequently, as illustrated in FIGS. 16A and 16B, the residual pattern PP1' is removed. The residual pattern PP1' may be removed using a strip solution, which, for example, may include ethylene carbonate.

Figure 17A:
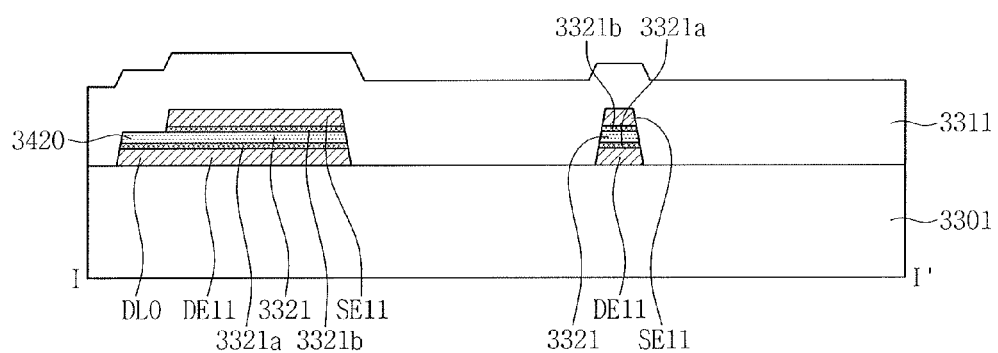
Figure 17B:
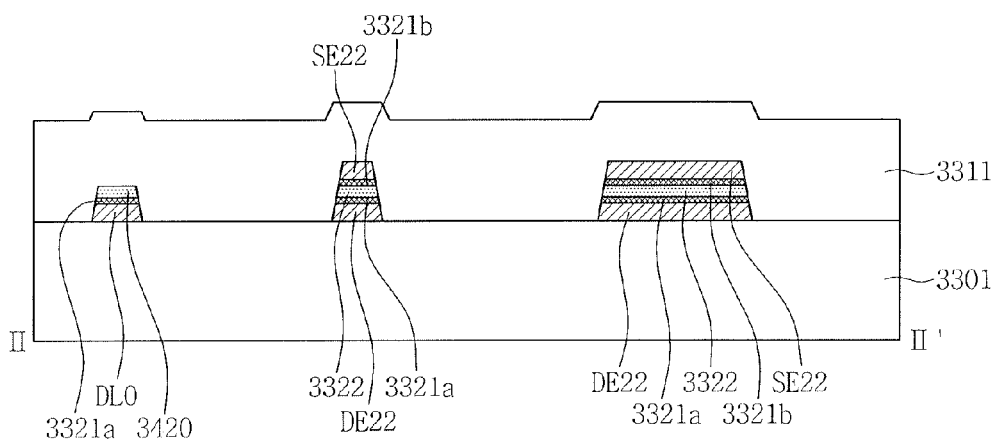

Subsequently, as illustrated in FIGS. 17A and 17B, a gate insulating layer 3311 is deposited on the first substrate 3301, the semiconductor layer 3420, the first source electrode SE11, and the second source electrode SE22. The gate insulating layer 3311 is deposited over the entire surface of the first substrate 3301 including the semiconductor layer 3420, the first source electrode SE11, and the second source electrode SE22.

The gate insulating layer 3311 may be deposited in a chemical vapor deposition (CVD) method. The gate insulating layer 3311 may include a material in the aforementioned gate insulating layer 311.

Figure 18A:
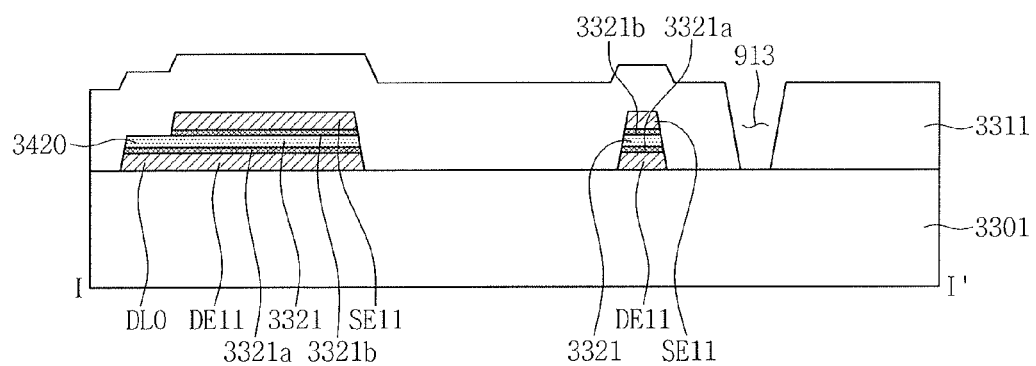
Figure 18B:
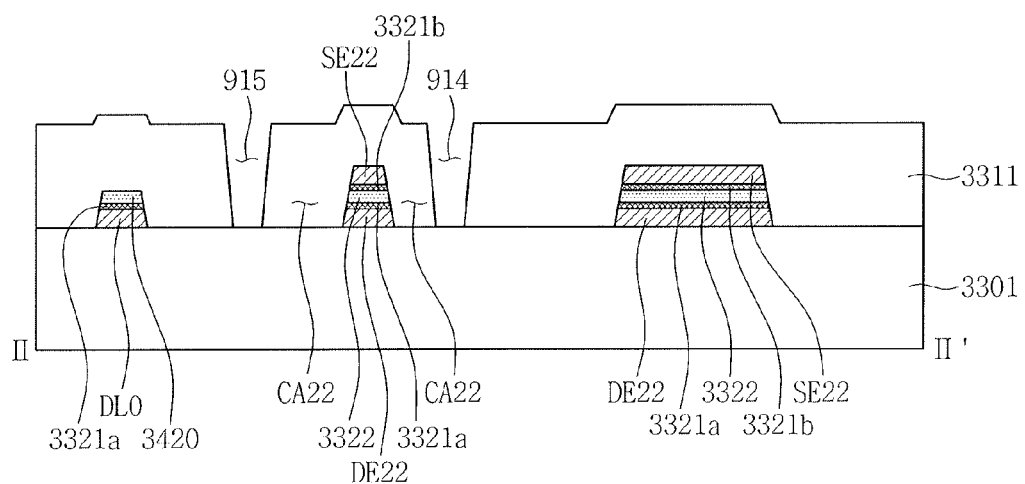

Subsequently, as illustrated in FIGS. 18A and 18B, a third hole 913, a fourth hole 914, and a fifth hole 915 are defined in the gate insulating layer 3311. A surface of the first substrate 3301 is exposed through the third hole 913, the fourth hole 914, and the fifth hole 915.

Subsequently, a gate metal layer may be deposited over the entire surface of the first substrate 3301 including the gate insulating layer 3311. The gate metal layer may be deposited in a physical vapor deposition (PVD) method such as sputtering.

Figure 19A:
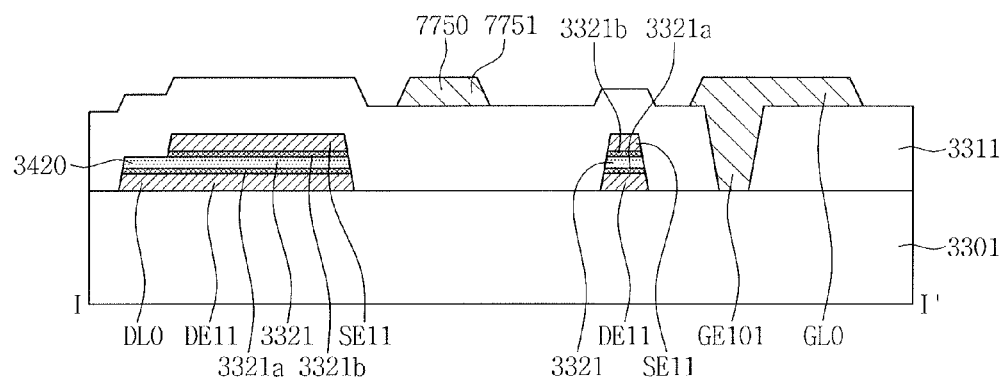
Figure 19B:
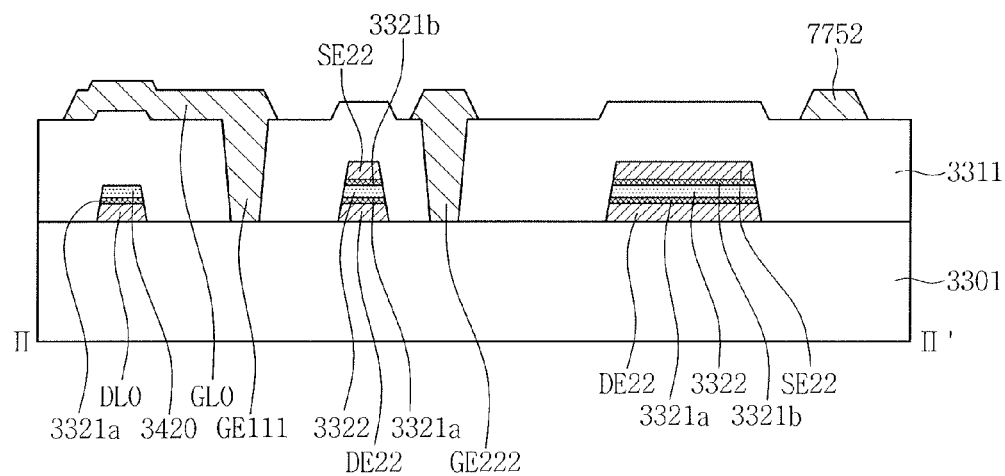

Subsequently, the gate metal layer is patterned through a photolithography process and an etching process such that a first gate electrode GE101, a main gate electrode GE222, and an auxiliary gate electrode GE111 are respectively formed in the third hole 913, the fourth hole 914, and the fifth hole 915, respectively, as illustrated in FIGS. 19A and 19B. In addition, a gate line GL0, a first storage electrode 7751, a second storage electrode 7752, and a storage line 7750 are formed on the gate insulating layer 3311.

Figure 20A:
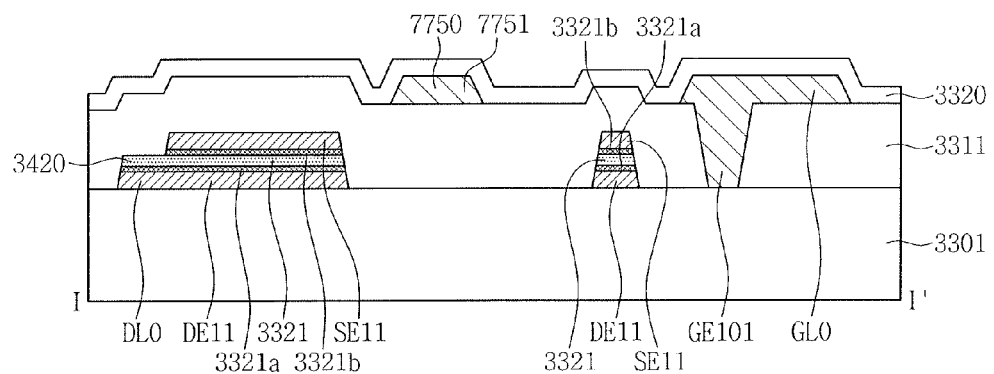
Figure 20B:
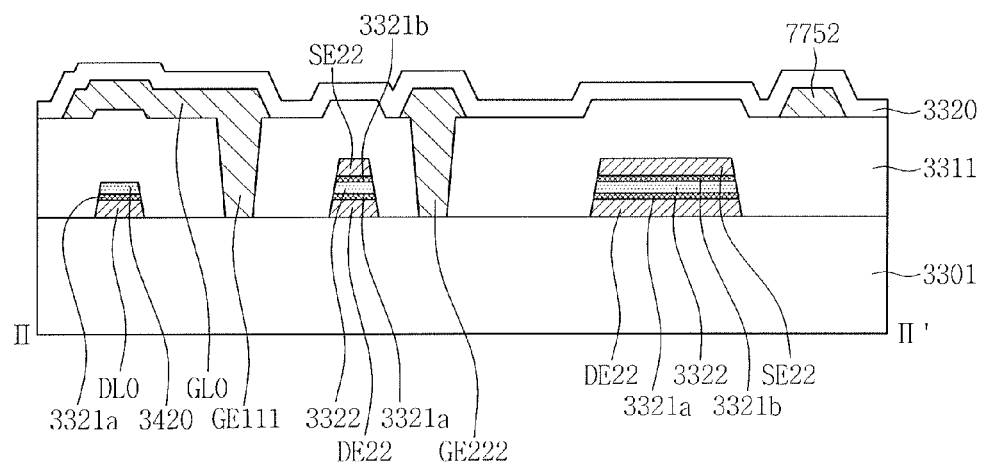

Subsequently, as illustrated in FIGS. 20A and 20B, a passivation layer 3320 is deposited over the entire surface of the first substrate 3301 including the gate line GL0, the first storage electrode 7751, the second storage electrode 7752, the storage line 7750, the main gate electrode GE222, and the gate insulating layer 3311.

The passivation layer 3320 may include substantially a same material as that in the passivation layer 3320.

Subsequently, a photosensitive organic material is formed over the entire surface of the first substrate 3301 including the passivation layer 3320.

Figure 21A:
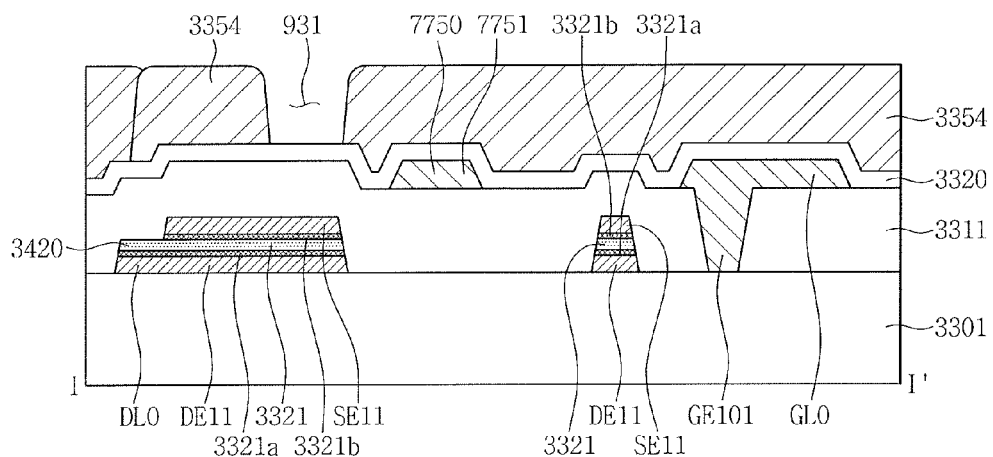
Figure 21B:
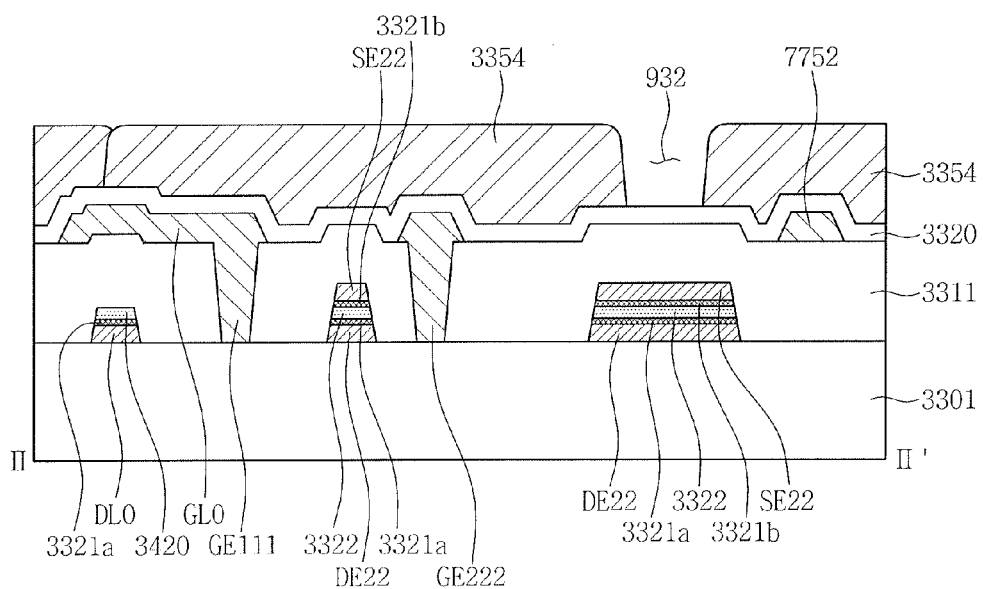

Subsequently, the photosensitive organic material is patterned through a photolithography process such that a color filter 3354 is formed in a first sub-pixel area P11 and a second sub-pixel area P22 as illustrated in FIGS. 21A and 21B. The color filter 3354 has a first hole 931 and a second hole 932. A portion of the passivation layer 3320 is exposed through the first hole 931 and the second hole 932 of the color filter 3354.

Figure 22A:
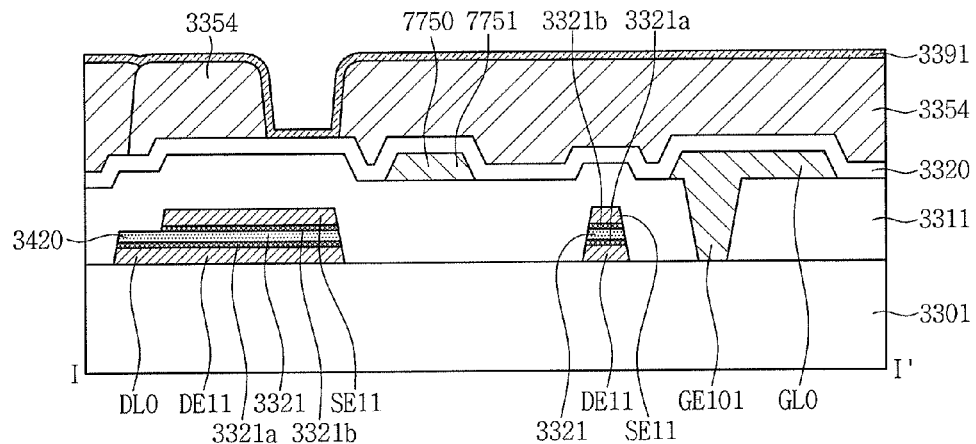
Figure 22B:
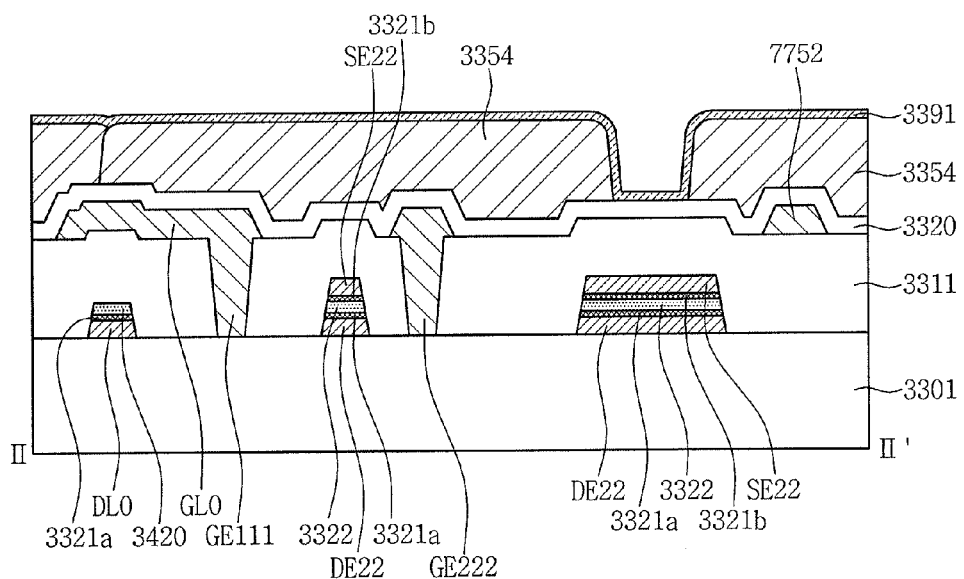

Subsequently, as illustrated in FIGS. 22A and 22B, a capping layer 3391 is deposited over the entire surface of the first substrate 3301 including the color filter 3354. The capping layer 3391 may include substantially a same material as in the capping layer 3391.

Figure 23A:
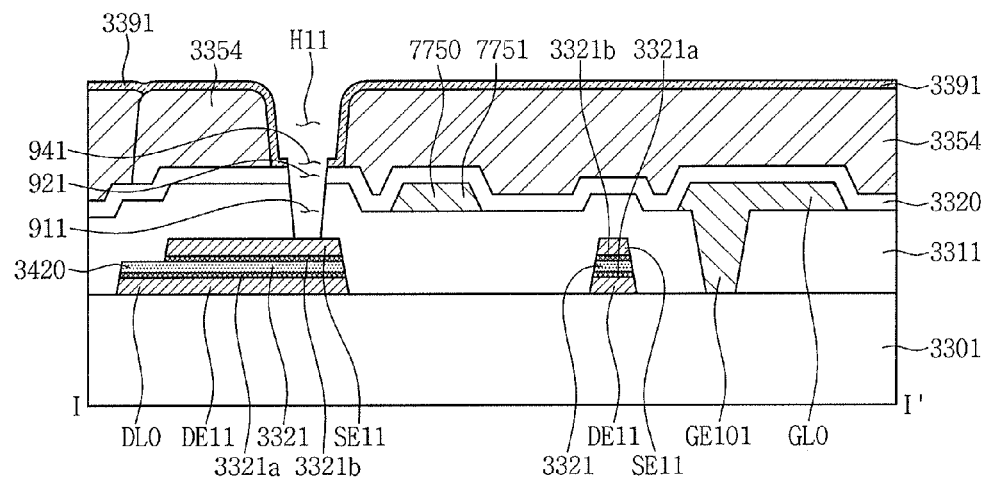
Figure 23B:
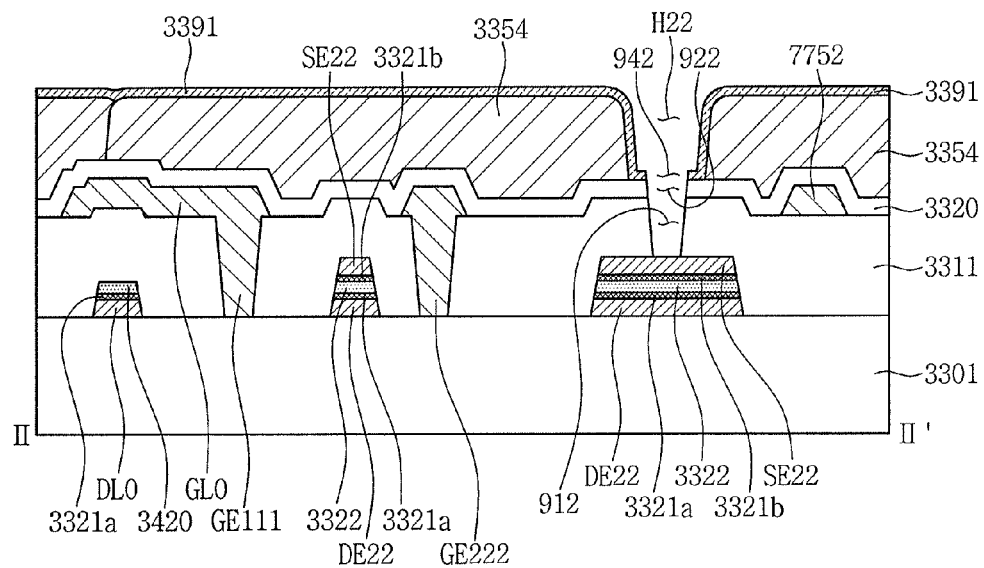
Figure 24A:
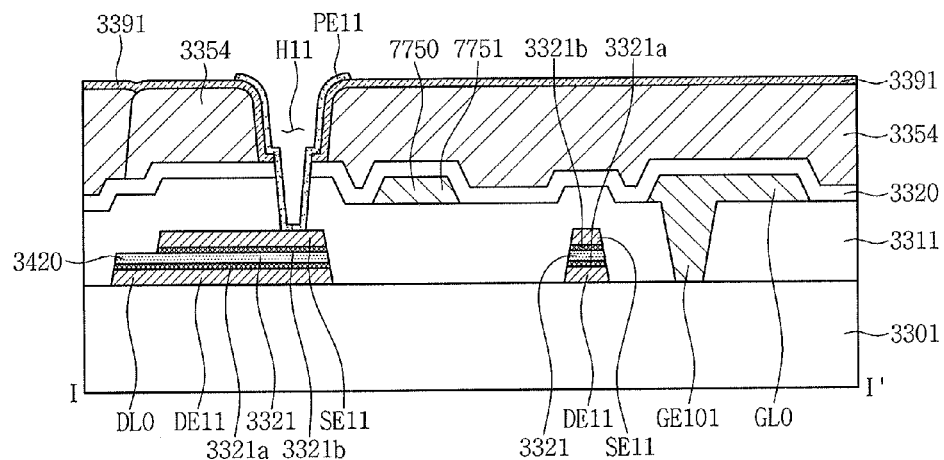
Figure 24B:
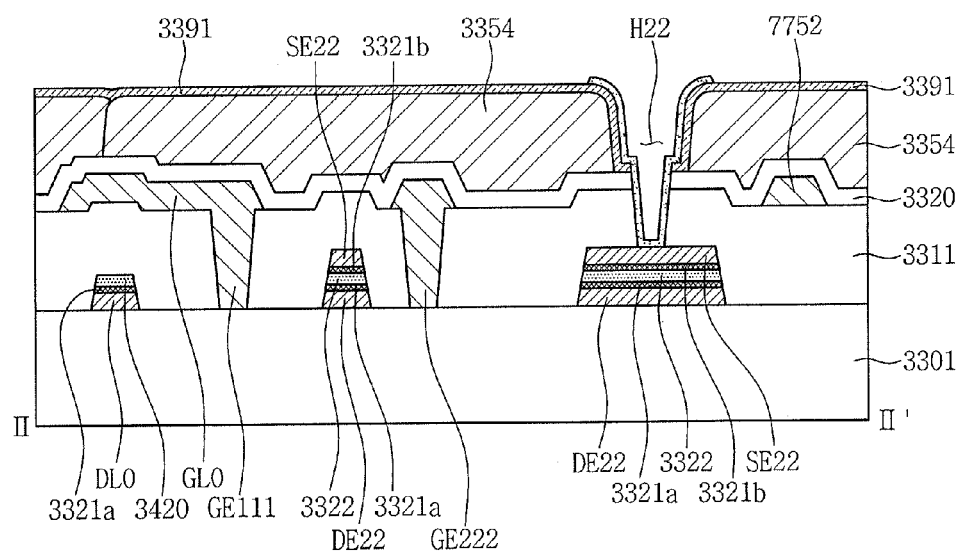

Subsequently, the capping layer 3391 and the passivation layer 3320 are selectively removed through a photolithography process and an etching process such that a first hole 941 and a second hole 942 are defined in the capping layer 3391, a first hole 921 and a second hole 922 are defined in the passivation layer 3320, and a first hole 911 and a second hole 912 are defined in the gate insulating layer 3311, as illustrated in FIGS. 23A and 23B.

A first contact hole H11 includes the first hole 911 of the gate insulating layer 3311, the first hole 921 of the passivation layer 3320, the first hole 931 of the color filter 3354, and the first hole 941 of the capping layer 3391. A portion of the first source electrode SE11 is exposed through the first contact hole H11.

A second contact hole H22 includes the second hole 912 of the gate insulating layer 3311, the second hole 922 of the passivation layer 3320, the second hole 932 of the color filter 3354, and the second hole 942 of the capping layer 3391. A portion of the second source electrode SE22 is exposed through the second contact hole H22.

Subsequently, a transparent metal layer is deposited over the entire surface of the first substrate 3301 including the capping layer 3391, the first source electrode SE11, and the second source electrode SE22. The transparent metal layer may include substantially a same material as in the first sub-pixel electrode PE1.

Subsequently, the transparent metal layer is patterned by a photolithography process and an etching process, such that a first sub-pixel electrode PE11 connected to the first source electrode SE11 through the first contact hole H11 is formed in the first sub-pixel area P11 and a second sub-pixel electrode PE22 connected to the second source electrode SE22 through the second contact hole H22 is formed in the second sub-pixel area P22.

Figure 25:
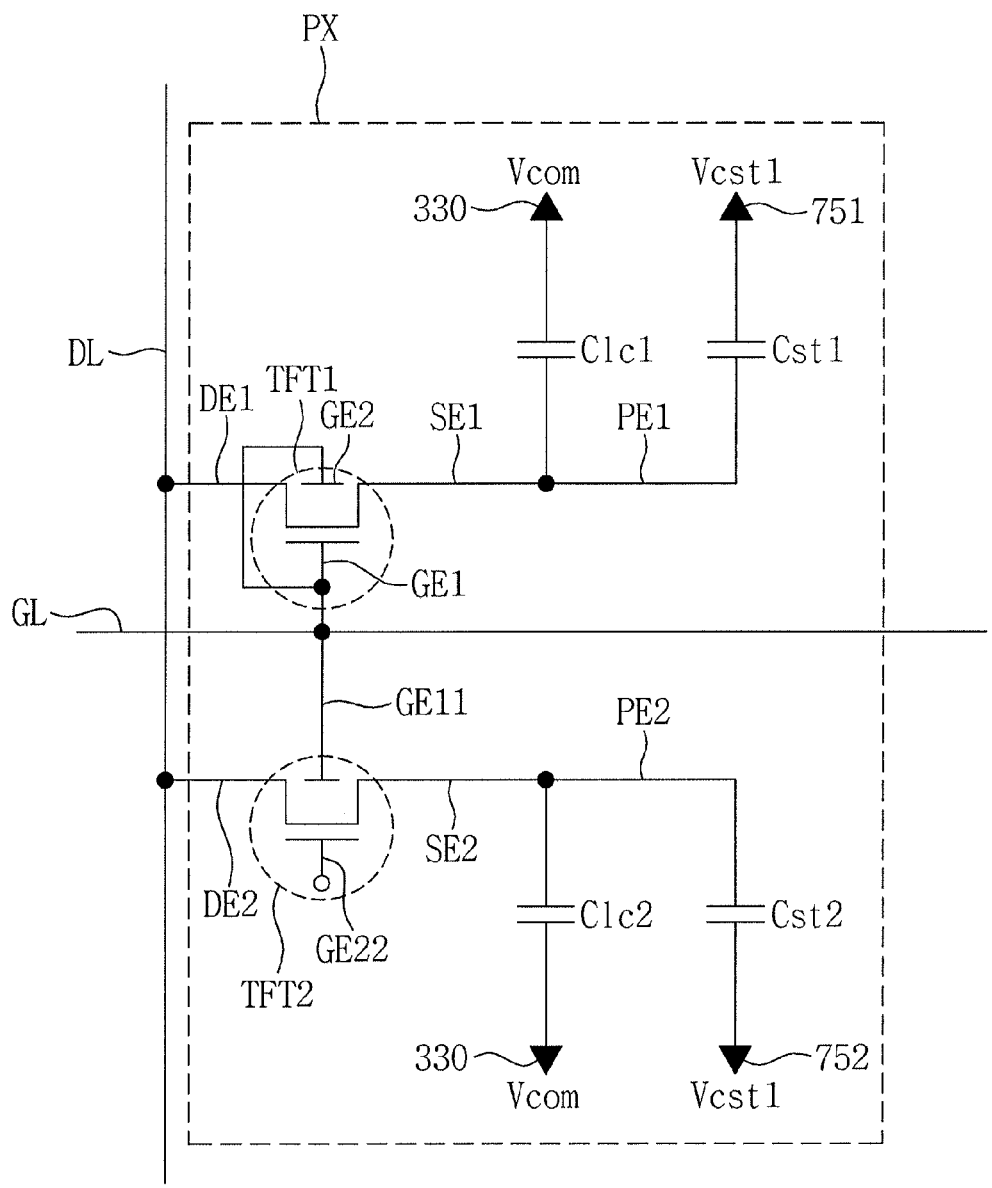
FIG. 25 illustrates an equivalent circuit diagram of a pixel provided in an alternative implementation of an LCD device.

FIG. 25 illustrates an equivalent circuit diagram of a pixel provided in an alternative implementation of an LCD device. As illustrated in FIG. 25, a first switching element TFT1 may further include an auxiliary gate electrode GE2, and the auxiliary gate electrode GE2 may be connected to a gate line GL. Other features in FIG. 25 may be substantially the same as configurations illustrated in FIG. 1.

Figure 26A:
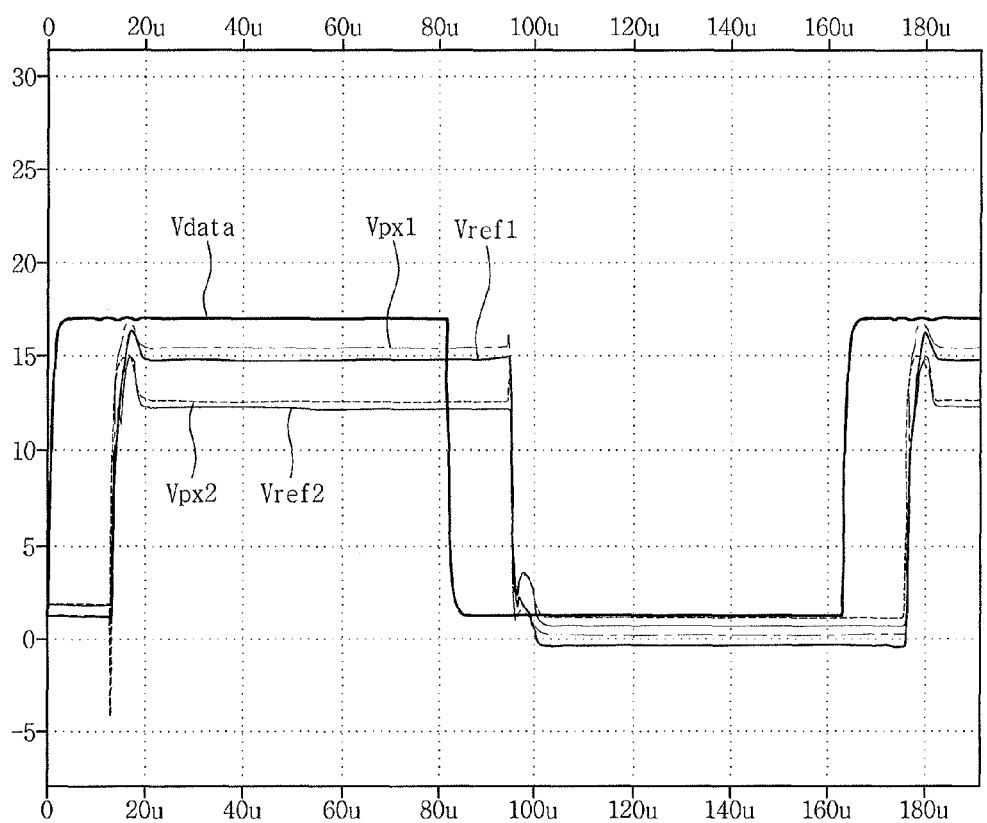
FIGS. 26A and 26B illustrate an effect of an implementation of an LCD device.
Figure 26B:
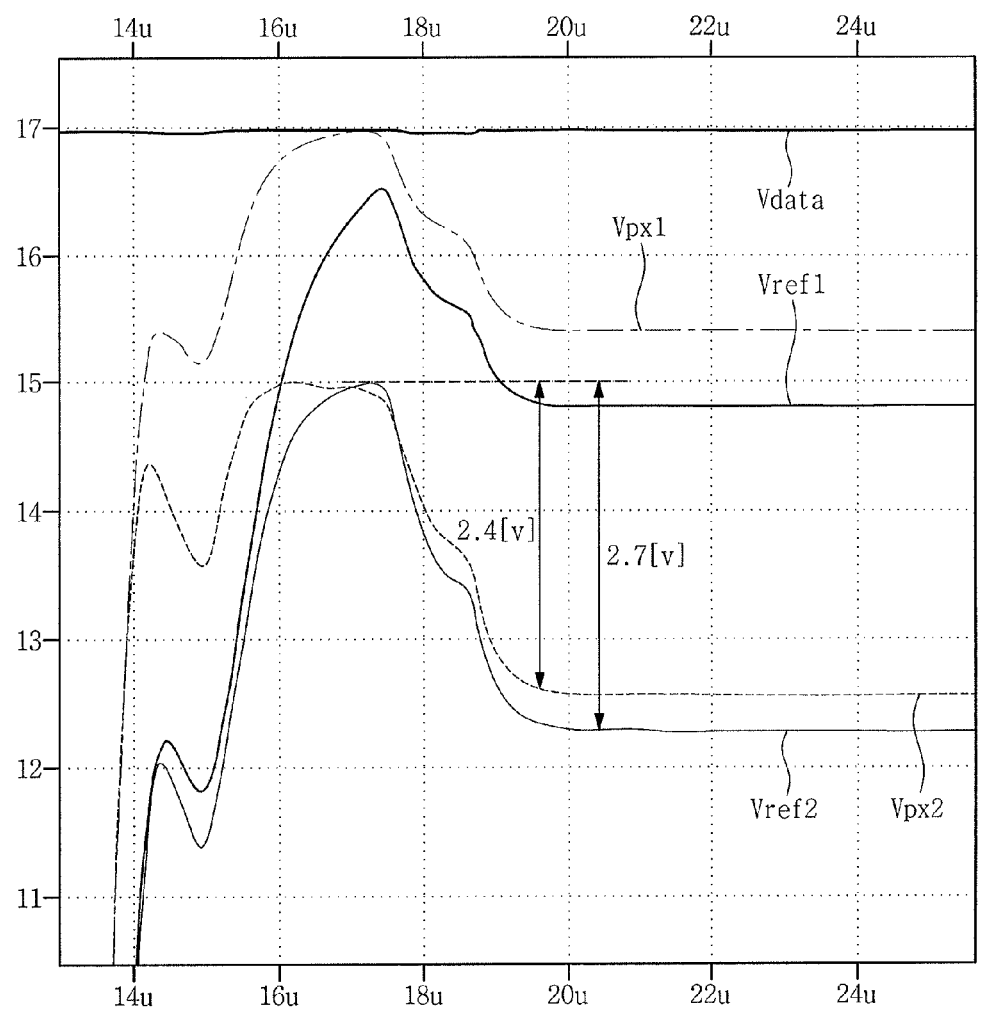

FIGS. 26A and 26B illustrate an effect of an implementation of an LCD device.

As illustrated in FIG. 26A, when a gate signal maintains a gate high voltage, a first switching element TFT1 and a second switching element TFT2 are turned on. In such an implementation, a first sub-pixel voltage Vpx1 and a second sub-pixel voltage Vpx2 are generated by a data voltage Vdata from a data line DL to a pixel.

A first reference voltage Vref1 refers to a voltage which may be applied to a first sub-pixel electrode PE1 based on the data voltage Vdata, and a second reference voltage Vref2 refers to a voltage which needs to be applied to a second sub-pixel electrode PE2 based on the data voltage Vdata.

As illustrated in FIG. 26, the first sub-pixel voltage Vpx1 is higher than the first reference voltage Vref1. The second sub-pixel voltage Vpx2 is higher than the second reference voltage Vref2. As such, the first switching element TFT1 and the second switching element TFT2 of an implementation of an LCD device may stably divide the data voltage to apply the divided voltages to the first sub-pixel electrode PE1 and the second sub-pixel voltage PE2. In addition, as the first and second sub-pixel voltages Vpx1 and Vpx2 are higher than the first and second reference voltages Vref1 and Vref2, respectively, a charging ratio of a pixel may be improved.

As illustrated in FIG. 26B, a kick-back voltage (2.4 [V]) to the second sub-pixel voltage Vpx2 is lower than a kick-back voltage (2.7 [V]) to the second reference voltage Vref2. Accordingly, one or more embodiments described herein may significantly reduce image sticking and flickering.

Figure 27A:
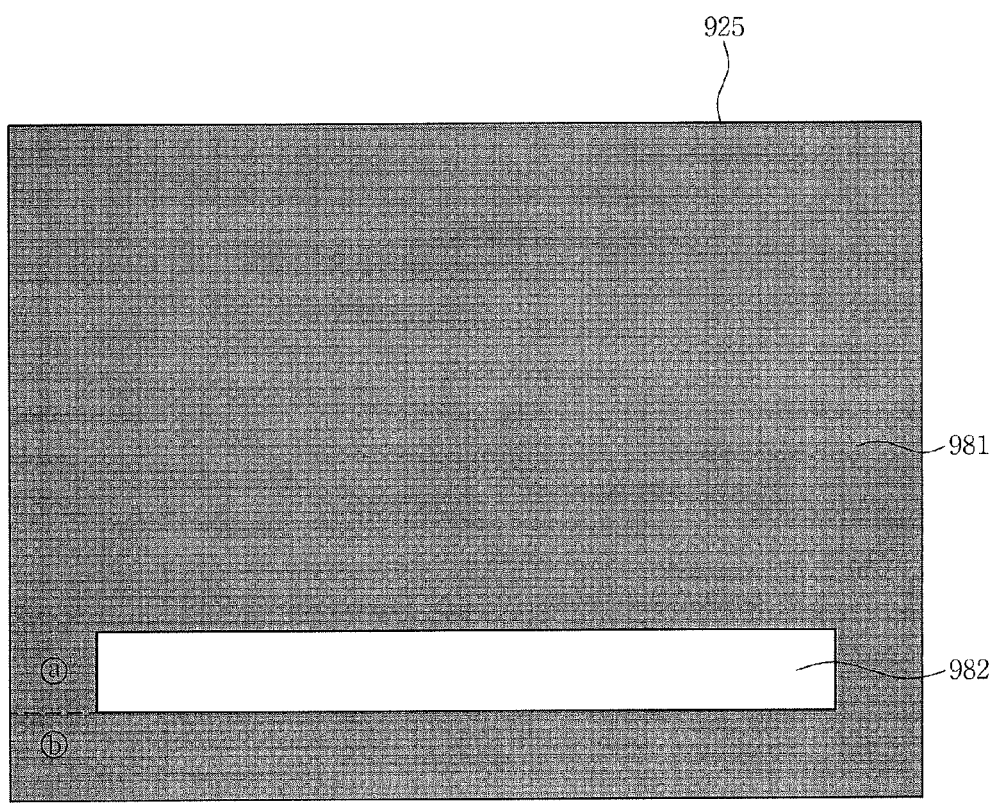
FIGS. 27A and 27b illustrate another effect of an implementation of an LCD device.
Figure 27B:
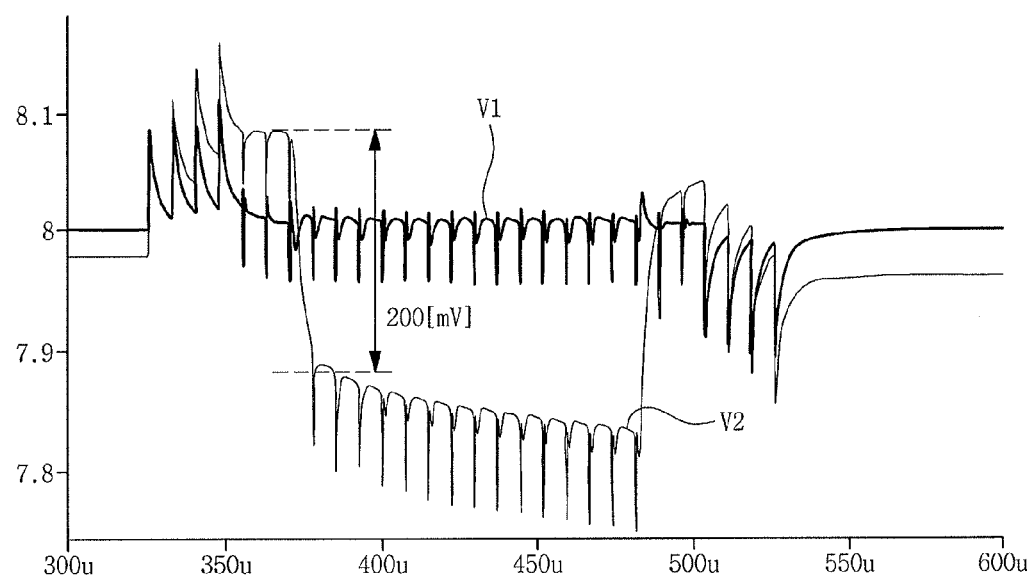

FIGS. 27A and 27b illustrate another embodiment of an LCD device. As illustrated in FIG. 27A, both of an image 981 having a middle gray level and an image 982 having a highest gray level may be displayed on a display screen 925 of an LCD device. The image 981 having a middle gray level refers to an image having a middle brightness. The image 982 having a highest gray level refers to an image having a highest brightness, e.g., an image having a white gray level.

A reference mark "V1" in FIG. 27B denotes a storage voltage (a first storage voltage or a second storage voltage) of an implementation of an LCD device. A reference mark "V2" denotes a storage voltage of a conventional LCD device.

In one type of LCD device which has been proposed, a storage electrode is directly connected to a data line. Accordingly, a storage voltage varies by a large extent based on a polarity of a data voltage applied to a pixel. For example, as illustrated in FIG. 27B, a voltage drop (IR drop) of about 200 [mV] occurs in a storage voltage. Accordingly, in the case that the image 981 having a middle gray level and the image 982 having a highest gray level are displayed together as illustrated in FIG. 27A, pixels in an area "ⓐ" right next to an area in which the image 982 having a highest gray level is displayed displays an image that has a gray level close to a white gray level rather than the middle gray level. Thus, the pixels in area ⓐ display an incorrect image. Accordingly, the brightness of an image displayed in area ⓐ differs from the brightness of an image displayed in area ⓑ. Thus, horizontal crosstalk may occur.

However, in accordance with one or more embodiments descried herein, even when a first switching element TFT1 and a second switching element TFT2 are turned on, a data line DL and a storage electrode (a first storage electrode and a second storage electrode) are not directly connected to one another. For example, a first storage capacitor Cst1 is between the data line DL and the first storage electrode 751, and a second storage capacitor Cst2 is between the data line DL and the second storage electrode 752. Accordingly, even though the polarity of the data voltage applied to a pixel is changed, variation of a storage voltage (a first storage voltage and a second storage voltage) may be significantly reduced. Accordingly, horizontal crosstalk may be suppressed.

In accordance with one or more of the aforementioned embodiments, an LCD device and a method of manufacturing the LCD device may provide the following effects. First, a data voltage may be divided by a first switching element and a second switching element that have different current driving capabilities. Accordingly, a first sub-pixel electrode and a second sub-pixel electrode may have different pixel voltages such that visibility of a pixel may be improved.

Second, a gate electrode of the first switching element and a gate electrode of the second switching element may include different resistive materials, respectively. In such an implementation, the first sub-pixel electrode and the second sub-pixel electrode may have different pixel voltages. Accordingly, visibility of the pixel may be improved.

Third, one pixel may generate two different sub-pixel voltages using two switching elements. Accordingly, an aperture ratio of the pixel may increase.

Fourth, a data line and a storage electrode are not directly connected. In such an implementation, variation of a first storage voltage and a second storage voltage may be significantly reduced. Accordingly, the occurrence of horizontal crosstalk may be significantly suppressed.

Fifth, a drain electrode, a first ohmic contact layer, a semiconductor layer, a second ohmic contact layer, and a source electrode are vertically stacked. Thus, a horizontal occupying area of a switching element including the drain electrode, the first ohmic contact layer, the semiconductor layer, the second ohmic contact layer, and the source electrode may be reduced. Accordingly, an aperture ratio of the pixel may further be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A liquid crystal display device, comprising:
a first substrate spaced from a second substrate;
a liquid crystal layer between the first and second substrates;
a gate line, a data line, a first sub-pixel electrode, and a second sub-pixel electrode on the first substrate;
a first switch connected to the gate line, the data line, and the first sub-pixel electrode; and
a second switch connected to the gate line, the data line, and the second sub-pixel electrode,
wherein the first switch includes a first gate electrode connected to the gate line and a first semiconductor layer spaced from the first gate electrode,
the second switch includes a second gate electrode connected to the gate line and a second semiconductor layer spaced from the second gate electrode,
a first distance between the first gate electrode and the first semiconductor layer is different from a second distance between the second gate electrode and the second semiconductor layer.

2. The device as claimed in claim 1, wherein the second distance is greater than the first distance.

3. The device as claimed in claim 1, wherein the second switch further includes a third gate electrode spaced from the second semiconductor layer.

4. The device as claimed in claim 3, wherein the third gate electrode is connected to the gate line.

5. The device as claimed in claim 3, wherein the third gate electrode does not contact any conductor including the gate line.

6. The device as claimed in claim 3, further comprising:
a bias line to transmit a bias voltage to the third gate electrode.

7. The device as claimed in claim 1, wherein the first switch further includes a fourth gate electrode connected to the gate line.

8. The device as claimed in claim 3, wherein in a channel area of the second switch a distance between the second semiconductor layer and the second gate electrode of the second switch is longer than a distance between the second semiconductor layer and the third gate electrode.

9. The device as claimed in claim 8, further comprising:
a first insulating layer between the second semiconductor layer and the second gate electrode in the channel area; and
a second insulating layer between the second semiconductor layer and the third gate electrode in the channel area, wherein the second insulating layer has a smaller thickness than the first insulating layer.

10. The device as claimed in claim 9, wherein the first insulating layer and the second insulating layer have a unitary construction.

11. The device as claimed in claim 1, wherein the second switch further includes:
a drain electrode on the first substrate and connected to the data line;
a source electrode on the drain electrode and connected to the second sub-pixel electrode; and
the second semiconductor layer is between the drain electrode and the source electrode.

12. The device as claimed in claim 11, further comprising
a first ohmic contact layer between the drain electrode and the second semiconductor layer; and
a second ohmic contact layer between the source electrode and the second semiconductor layer.

13. The device as claimed in claim 11, wherein:
the second switch further includes a third gate electrode spaced from the second semiconductor layer, and
the second gate electrode and the third gate electrode extend in a perpendicular direction with respect to a surface of the first substrate.

14. The device as claimed in claim 12, wherein:
the second switch further includes a third gate electrode spaced from the second semiconductor layer,
a first portion of the second gate electrode and a first portion of the third gate electrode are on a same layer as the first ohmic contact layer, and
a second portion of the second gate electrode and a second portion of the third gate electrode are on a same layer as the second ohmic contact layer.

15. The device as claimed in claim 11, wherein:
the second switch further includes a third gate electrode spaced from the second semiconductor layer, and
at least a portion of the second gate electrode and at least a portion of the third gate electrode are on a same layer as the second semiconductor layer.

16. The device as claimed in claim 15, wherein:
the second switch further includes a third gate electrode spaced from the second semiconductor layer,
a first portion of the second gate electrode and a first portion of the third gate electrode are on a same layer as the drain electrode, and
a second portion of the second gate electrode and a second portion of the third gate electrode are on a same layer as the source electrode.

17. The device as claimed in claim 1, wherein the second gate electrode and the gate line are on different layers.

18. The device as claimed in claim 17, wherein the second gate electrode is on a same layer as one of the first sub-pixel electrode or the second sub-pixel electrode.

19. The device as claimed in claim 18, wherein the second gate electrode includes a same material as one of the first sub-pixel electrode, the second sub-pixel electrode, or the gate line.

20. The device as claimed in claim 17, further comprising:
an insulating layer having a contact hole connecting the second gate electrode and the gate line.

21. A method for manufacturing a liquid crystal display device, the method comprising:
sequentially stacking a first metal layer, a first impurity semiconductor material layer, a semiconductor material layer, a second impurity semiconductor material layer, and a second metal layer on a substrate;
forming a first photoresist pattern and a second photoresist pattern on the second metal layer, the second photoresist pattern having a thickness less than the first photoresist pattern;
forming a drain electrode on the substrate, a first ohmic contact layer on the drain electrode, a semiconductor layer on the first ohmic contact layer, an impurity semiconductor pattern on the semiconductor layer, and a source metal layer on the impurity semiconductor pattern by removing the first metal layer, the first impurity semiconductor material layer, the semiconductor material layer, the second impurity semiconductor material layer, and the second metal layer using the first and second photoresist patterns as a mask;
removing a portion of the first photoresist pattern and the second photoresist pattern;
forming a second ohmic contact layer on the semiconductor layer and a source electrode on the second ohmic contact layer by removing the impurity semiconductor pattern and the source metal layer using the first photoresist pattern as a mask;
removing the first photoresist pattern;
forming a gate insulating layer on the substrate, the semiconductor layer, and the source electrode;
defining a first hole in the gate insulating layer;
forming a first gate electrode in the first hole of the gate insulating layer;
forming a passivation layer on the first gate electrode;
defining a contact hole in the passivation layer, the contact hole exposing the source electrode; and
forming a pixel electrode on the passivation layer, the pixel electrode connected to the source electrode through the contact hole.

* * * * *